US009734272B2

(12) United States Patent
Clark et al.

(10) Patent No.: US 9,734,272 B2
(45) Date of Patent: Aug. 15, 2017

(54) TECHNIQUES FOR GENERATING PHYSICAL LAYOUTS OF IN SILICO MULTI MODE INTEGRATED CIRCUITS

(71) Applicants: Lawrence T. Clark, Phoenix, AZ (US); Dan Wheeler Patterson, Scottsdale, AZ (US); Chandarasekaran Ramamurthy, Tempe, AZ (US); Srivatsan Chellappa, Tempe, AZ (US)

(72) Inventors: Lawrence T. Clark, Phoenix, AZ (US); Dan Wheeler Patterson, Scottsdale, AZ (US); Chandarasekaran Ramamurthy, Tempe, AZ (US); Srivatsan Chellappa, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 168 days.

(21) Appl. No.: 14/739,347

(22) Filed: Jun. 15, 2015

(65) Prior Publication Data
US 2015/0363517 A1    Dec. 17, 2015

Related U.S. Application Data

(60) Provisional application No. 62/011,822, filed on Jun. 13, 2014.

(51) Int. Cl.
*G06F 17/50* (2006.01)
(52) U.S. Cl.
CPC ........ *G06F 17/505* (2013.01); *G06F 17/5072* (2013.01)

(58) Field of Classification Search
CPC ...................................... G06F 17/505
(Continued)

(56) References Cited

U.S. PATENT DOCUMENTS 4,621,201 A   11/1986   Amdahl et al.
5,883,814 A   3/1999    Luk et al.
(Continued)

OTHER PUBLICATIONS

Notice of Allowance for U.S. Appl. No. 13/487,859, mailed Mar. 20, 2014, 13 pages.
(Continued)

*Primary Examiner* — Suchin Parihar
(74) *Attorney, Agent, or Firm* — Withrow & Terranova, P.L.L.C.

(57) ABSTRACT

This disclosure relates generally to computerized systems and methods of producing a physical representation of an in silico Integrated Circuit (IC) having an in silico Multi-Mode Redundant (MMR) pipeline circuit. An IC layout of the in silico IC is initially generated with the electronic design automation (EDA) program. Multi-Mode Redundant Self-Correcting Sequential State Element (MMRSCSSE) layouts are then rendered immotile while initial redundant Combinational Logic Circuit (CLC) layouts are removed from the IC layout after the MMRSCSSE layouts have been rendered immotile. By first placing the MMRSCSSE layouts and then rendering them immotile, the remaining logic can be placed again and optimized without compromising critical node spacing. As such, the described method provides for a more efficient way to create the IC layout of the in silico IC while maintaining critical node spacing.

25 Claims, 16 Drawing Sheets

(58) Field of Classification Search
USPC .......................................................... 716/103
See application file for complete search history.

(56) References Cited

U.S. PATENT DOCUMENTS

| | | | |
|---|---|---|---|
| 6,104,211 | A | 8/2000 | Alfke |
| 6,127,864 | A | 10/2000 | Mavis et al. |
| 6,526,559 | B2 | 2/2003 | Schiefele et al. |
| 6,646,464 | B2 | 11/2003 | Maruyama |
| 6,898,770 | B2 | 5/2005 | Boluki et al. |
| 7,138,442 | B2 | 11/2006 | Smith et al. |
| 7,212,448 | B1 | 5/2007 | Trimberger |
| 7,310,759 | B1 | 12/2007 | Carmichael et al. |
| 7,404,161 | B2 | 7/2008 | Dutt et al. |
| 7,649,216 | B1 | 1/2010 | Clark et al. |
| 7,719,304 | B1 | 5/2010 | Clark et al. |
| 7,859,292 | B1 | 12/2010 | Shuler, Jr. |
| 7,904,772 | B2 | 3/2011 | Nicolaidis |
| 7,920,410 | B1 | 4/2011 | Lee et al. |
| 8,015,533 | B1 | 9/2011 | Burstein et al. |
| 8,122,317 | B1 | 2/2012 | Clark et al. |
| 8,161,367 | B2 | 4/2012 | Chandra |
| 8,397,130 | B2 | 3/2013 | Clark et al. |
| 8,397,133 | B2 | 3/2013 | Clark et al. |
| 8,489,919 | B2 | 7/2013 | Clark et al. |
| 8,493,120 | B2 | 7/2013 | Choudhury et al. |
| 8,495,548 | B2 | 7/2013 | Agarwal et al. |
| 8,729,923 | B2 | 5/2014 | Ramachandra |
| 8,791,718 | B2 | 7/2014 | Clark et al. |
| 8,863,064 | B1 | 10/2014 | Tien et al. |
| 9,038,012 | B2 | 5/2015 | Clark et al. |
| 9,041,429 | B2 | 5/2015 | Clark |
| 9,054,688 | B2 | 6/2015 | Clark et al. |
| 2006/0220700 | A1 | 10/2006 | Hoover et al. |
| 2007/0277137 | A1* | 11/2007 | Savithri ............... G06F 17/5068 716/115 |
| 2009/0184733 | A1 | 7/2009 | Lilja |
| 2009/0204933 | A1 | 8/2009 | Rezgui |
| 2012/0180005 | A1 | 7/2012 | Lilja |
| 2012/0306535 | A1* | 12/2012 | Clark et al. ..................... 326/46 |
| 2014/0049286 | A1* | 2/2014 | Clark ............................. 326/16 |
| 2014/0077854 | A1 | 3/2014 | Clark et al. |

OTHER PUBLICATIONS

Anelli, G. et al., "Radiation tolerant VLSI circuits in standard deep submicron CMOS technologies for the LHC experiments: practical design aspects," IEEE Transactions on Nuclear Science, vol. 46, Issue 6, Dec. 1999, pp. 1690-1696.

Author Unknown, "RTAX-S/SL and RTAX-DSP Radiation-Tolerant FPGAs," Microsemi Corporation, Revision 15, May 2012, www.actel.com/documents/RTAXS_DS.pdf, 278 pages.

Benedetto, J. et al., "Digital single event transient trends with technology node scaling," IEEE Transactions on Nuclear Science, vol. 53, Issue 6, Dec. 2006, pp. 3462-3465.

Benedetto, J. et al., "Heavy ion-induced digital single-event transients in deep submicron processes," IEEE Transactions on Nuclear Science, vol. 51, Issue 6, Dec. 2004, pp. 3480-3485.

Benini, L. et al., "A survey of design techniques for system-level dynamic power management," IEEE Transactions on Very Large Scale Integration (VLSI) Syst., vol. 8, Issue 3, Jun. 2000, pp. 299-316.

Biswas, Arijit, et al., "Computing Architectural Vulnerability Factors for Address-Based Structures," 32nd International Symposium on Computer Architecture, Jun. 2005, IEEE, 12 pages.

Braatz, James, et al., "ASIC Design System for Radiation Environments," Fourth Annual IEEE International ASIC conference and Exhibit, Sep. 23-27, 1991, Rochester, New York, IEEE, 4 pages.

Cabanas-Holmen, Manuel, et al., "Predicting the Single-Event Error Rate of a Radiation Hardened by Design Microprocessor," IEEE Transactions on Nuclear Science, vol. 58, Issue 6, Dec. 2011, IEEE, pp. 2726-2733.

Calin, T., et al., "Upset Hardened Memory Design for Submicron CMOS Technology," IEEE Transactions on Nuclear Science, vol. 43, No. 6, Dec. 1996, pp. 2874-2878.

Chellappa, Srivatsan, et al., "Advanced Encryption System with Dynamic Pipeline Reconfiguration for Minimum Energy Operation," 16th International Symposium on Quality Electronic Design, Mar. 2-4, 2015, Santa Clara, California, IEEE, pp. 201-206.

Clark, Lawrence, et al., "A Dual Mode Redundant Approach for Microprocessor Soft Error Hardness," IEEE Transactions on Nuclear Science, vol. 58, Issue 6, Dec. 2011, IEEE, pp. 3018-3025.

Clark, Lawrence, et al., "An Embedded Microprocessor Radiation Hardened by Microarchitecture and Circuits," IEEE Transactions on Computers, vol. 65, No. 2, Apr. 2015, IEEE Computer Society, 14 pages.

Clark, Lawrence, et al., "Methodical Design Approaches to Radiation Effects Analysis and Mitigation in Flip-flop Circuits," IEEE Computer Society Annual Symposium on VLSI, Jul. 9-11, 2014, Tampa, Florida, IEEE, pp. 595-600.

Diehl, S.E. et al., "Considerations for single event immune VLSI logic," IEEE Transactions Nuclear Science, vol. 30, Issue 6, 1983, pp. 4501-4507.

Dodd, P. et al., "Production and propagation of single-event transients in high-speed digital logic ICs," IEEE Transactions on Nuclear Science, vol. 51, Issue 6, Dec. 2004, pp. 3278-3284.

Drake, Alan J., et al., "A Self-Correcting Soft Error Tolerant Flop-Flop," 12th NASA Symposium on VLSI Design, Oct. 4-5, 2005, 5 pages.

Dumitru, Radu, et al.,"130nm Single Event Upset Performance Evaluation: Commercial vs. Hardened by Design Architectures," IEEE Radiation Effects Data Workshop, Jul. 25-29, 2011, Las Vegas, Nevada, IEEE, 6 pages.

Gadlage, M. et al., "Single event transient pulse widths in digital microcircuits," IEEE Transactions on Nuclear Science, vol. 51, Issue 6, Dec. 2004, pp. 3285-3290.

Haddad, Nadim, et al., "Second Generation (200MHz) RAD750 Microprocessor Radiation Evaluation," European Conference on Radiation and Its Effects on Components and Systems, Sep. 19-23, 2011, Sevilla, Spain, IEEE, pp. 877-880.

Hansen, D. et al., "Clock, flip-flop, and combinatorial logic contributions to the SEU cross section in 90 nm ASIC technology," IEEE Transactions on Nuclear Science, vol. 56, Issue 6, Dec. 2009, pp. 3542-3550.

Hazucha, Peter, et al., "Measurements and Analysis of SER-Tolerant Latch in a 90-nm Dual-VT CMOS Process," IEEE Journal of Solid-State Circuits, vol. 39, Issue 9, Sep. 2004, IEEE, pp. 1536-1543.

Hindman, Nathan, et al., "Fully Automated, Testable Design of Fine-Grained Triple Mode Redundant Logic," IEEE Transactions on Nuclear Science, vol. 58, Issue 6, Dec. 2011, IEEE, pp. 3046-3052.

Hindman, Nathan, et al., "High Speed Redundant Self-correcting Circuits for Radiation Hardened by Design Logic," European Conference on Radiation and Its Effects on Components and Systems, Sep. 14-18, 2009, Bruges, Belgium, IEEE, pp. 465-472.

Hoang, T. et al., "A Radiation Hardened 16-Mb SRAM for Space Applications," IEEE Aerospace Conference, Mar. 3-10, 2007, pp. 1-6.

Knudsen, Jonathan E., et al., "An Area and Power Efficient Radiation Hardened by Design Flip-Flop," IEEE Transactions on Nuclear Science, vol. 53, No. 6, Dec. 2006, pp. 3392-3399.

Kobayashi, D. et al., "Analytical Expression for Temporal Width Characterization of Radiation-Induced Pulse Noises in SOI CMOS Logic Gates," IEEE 47th International Reliability Physics Symposium (IRPS), Montreal, Canada, 2009, pp. 165-169.

Lacoe, Ronald C., et al., "Application of Hardness-By-Design Methodology to Radiation-Tolerant ASIC Technologies," IEEE Transactions on Nuclear Science, vol. 47, No. 6, Dec. 2000, pp. 2334-2341.

Liden, Peter, et al., "On Latching Probability of Particle Induced Transients in Combinational Networks," Twenty-Fourth International Symposium on Fault-Tolerant Computing, Jun. 15-17, 1994, Austin, Texas, IEEE, pp. 340-349.

(56) References Cited

OTHER PUBLICATIONS

Matush, Bradley I., et al., "Area-Efficient Temporally Hardened by Design Flip-Flop Circuits," IEEE Transactions on Nuclear Science, vol. 57, No. 6, Dec. 2010, pp. 3588-3595.

Mavis, David G., et al., "Soft Error Rate Mitigation Techniques for Modern Microcircuits," 40th Annual International Reliability Physics Symposium, Dallas, Texas, Copyright: 2002, pp. 216-225.

Mitra, Subhasish, et al., "Logic Soft Errors in Sub-65nm Technologies Design and CAD Challenges," Proceedings of the 42nd Design Automation Conference, Jun. 13-17, 2005, Anaheim, California, IEEE, 3 pages.

Mitra, Subhasish, et al., "Robust System Design with Built-In Soft-Error Resilience," Computer, vol. 38, Issue 2, Feb. 2005, IEEE Computer Society, pp. 43-52.

Morgan, Keith S., et al., "A Comparison of TMR with Alternative Fault-Tolerant Design Techniques for FPGAs," IEEE Transactions on Nuclear Science, vol. 54, No. 6, Dec. 2007, pp. 2065-2072.

Nicklaw, Christopher, et al., "Hierarchical CAD Tools for Radiation Hardened Mixed Signal Electronic Circuits," Technical Report A-2, Jan. 28, 2005, Silvaco Data Systems, Santa Clara, California, 37 pages.

Quinn, Heather, et al., "A Review of Xilinx FPGA Architectural Reliability Concerns from Virtex to Virtex-5," Radiation and Its Effects on Components and Systems (RADECS), Sep. 2007, 8 pages.

Ricci, F. et al., "A 1.5 GHz 90 nm embedded microprocessor core," 2005 Symposium on VLSI Circuits Digest of Technical Papers, 2005, pp. 12-15.

Seifert, Norbert, et al., "Radiation-Induced Clock Jitter and Race," 43rd Annual International Reliability Physics Symposium, San Jose, California, 2005, IEEE, pp. 215-222.

Sexton, F.W. et al., "SEU simulation and testing of resistor-hardened D-latches in the SA3300 microprocessor," IEEE Transactions on Nuclear Science, vol. 38, Issue 6, Dec. 1991, pp. 1521-1528.

Shambhulingaiah, Sandeep et al., "Temporal Sequential Logic Hardening by Design with a Low Power Delay Element," RADECS 2011 Proceedings, Copyright: 2011, pp. 144-149.

Shuler, R. et al., "Comparison of dual-rail and TMR logic cost effectiveness and suitability for FPGAs with reconfigurable SEU tolerance," IEEE Transactions on Nuclear Science, vol. 56, Issue 1, Feb. 2009, pp. 214-219.

Sturesson, F., et al., "Radiation Characterization of a Dual Core LEON3-FT Processor," European Conference on Radiation and Its Effects on Components and Systems, Sep. 19-23, 2011, Sevilla, Spain, IEEE, pp. 938-944.

Tipton, A. D. et al., "Device-orientation effects on multiple-bit upset in 65 nm SRAMs," IEEE Transactions on Nuclear Science, vol. 55, Issue 6, Dec. 2008, pp. 2880-2885.

Turowski, M. et al., "Mixed-mode simulation and analysis of digital single event transients in fast CMOS ICs," 14th International Conference on Mixed Design of Integrated Circuits and Systems, Jun. 21-23, 2007, pp. 433-438.

Warren, K. et al., "Heavy ion testing and single event upset rate prediction considerations for a DICE flip-flop," IEEE Transactions on Nuclear Science, vol. 56, Issue 6, Dec. 2009, pp. 3130-3137.

Yao, Xiaoyin, et al., "A 90nm Bulk CMOS Radiation Hardened by Design Cache Memory," European Conference on Radiation and Its Effects on Components and Systems, Sep. 14-18, 2009, Bruges, Belgium, IEEE, pp. 473-480.

Quayle Action for U.S. Appl. No. 14/304,155, mailed Nov. 28, 2014, 7 pages.

Notice of Allowance for U.S. Appl. No. 14/304,155, mailed Feb. 23, 2015, 9 pages.

Non-Final Office Action for U.S. Appl. No. 14/031,585, mailed Nov. 28, 2014, 8 pages.

Notice of Allowance for U.S. Appl. No. 14/062,127, mailed Dec. 2, 2014, 11 pages.

Non-Final Office Action for U.S. Appl. No. 13/487,859, mailed Sep. 6, 2013, 17 pages.

\* cited by examiner

TECHNIQUES FOR GENERATING PHYSICAL LAYOUTS OF IN SILICO MULTI MODE INTEGRATED CIRCUITS

RELATED APPLICATIONS

This application claims the benefit of provisional patent application Ser. No. 62/011,822, filed Jun. 13, 2014, the disclosure of which is hereby incorporated by reference in its entirety.

FIELD OF THE DISCLOSURE

This disclosure relates generally to computerized systems and methods of generating physical representations of an in silico integrated circuit.

BACKGROUND

One technique for ameliorating the effects of high energy radiation is to provide hardening elements and/or redundancy in a Sequential State Element (SSE). Hardening elements either correct, or operate to allow the SSE to correct upsets, or prevent the SSE from transitioning erroneously, due to radiation strikes. These state machines are generally designed using an electronic computational system executing an Electronic Design Automation (EDA) program. The EDA program can be implemented by the electronic computational system so as to generate a physical representation of an in silico Integrated Circuit (IC), which can then be used in a foundry to create a physical IC. However, SSEs that utilize redundancy in order to correct soft errors require critical nodes be spaced appropriately. Otherwise, radiation strikes can cause soft errors that subvert the self-correction provided by the redundant SSEs. Unfortunately, EDA programs generally place components as close together as possible in order to create more spatially efficient designs. As such, automatic placement with EDA programs often results in IC layouts that do not provide critical node spacing. Therefore, humans have to determine where to put SSE layouts within these designs, which is extremely tedious and time consuming. Therefore, more efficient methods of creating radiation hardened designs with the placement tools provided by an EDA program are needed.

SUMMARY

This disclosure relates generally to computerized systems and methods of producing a physical representation of an in silico integrated circuit (IC). For example, the in silico IC may include an in silico multi-mode redundant (MMR) pipeline circuit. In one embodiment, an electronic computation system loads a gate-level netlist of the in silico IC into an electronic design automation (EDA) program. The electronic computation system then generates an IC layout of the in silico IC based on the gate-level netlist with the EDA program. The IC layout has an MMR pipeline circuit layout of the in silico MMR pipeline circuit, and the MMR pipeline circuit layout includes initial redundant Combinational Logic Circuit (CLC) layouts and Multi-Mode Redundant Self-Correcting Sequential State Element (MMRSCSSE) layouts. The electronic computation system then renders the MMRSCSSE layouts immotile within the IC layout and removes the initial redundant CLC layouts of the MMR pipeline circuit layout from the IC layout, updated redundant CLC layouts in the MMR pipeline circuit layout are then placed by the electronic computation system based on the gate-level netlist with the EDA program after the MMRSCSSE layouts have been rendered immotile. By first placing the MMRSCSSE layouts and then rendering them immotile, the remaining logic can be placed again and optimized without compromising critical node spacing. As such, the described method provides for a more efficient way to create the IC layout of the in silico IC while maintaining critical node spacing.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
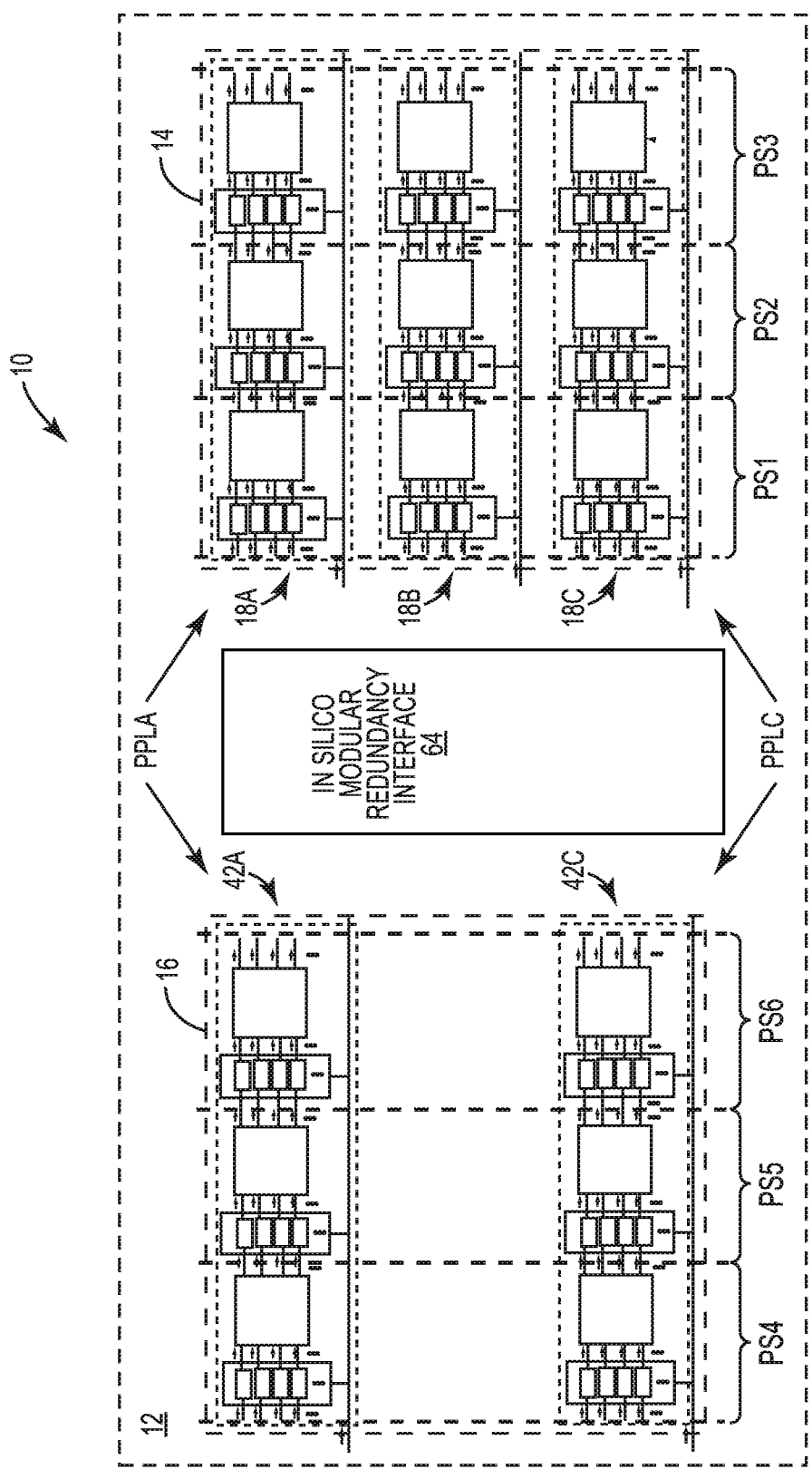
FIG. 1 is a visual representation of one embodiment of an in silico Integration Circuit (IC).
Figure 1A:
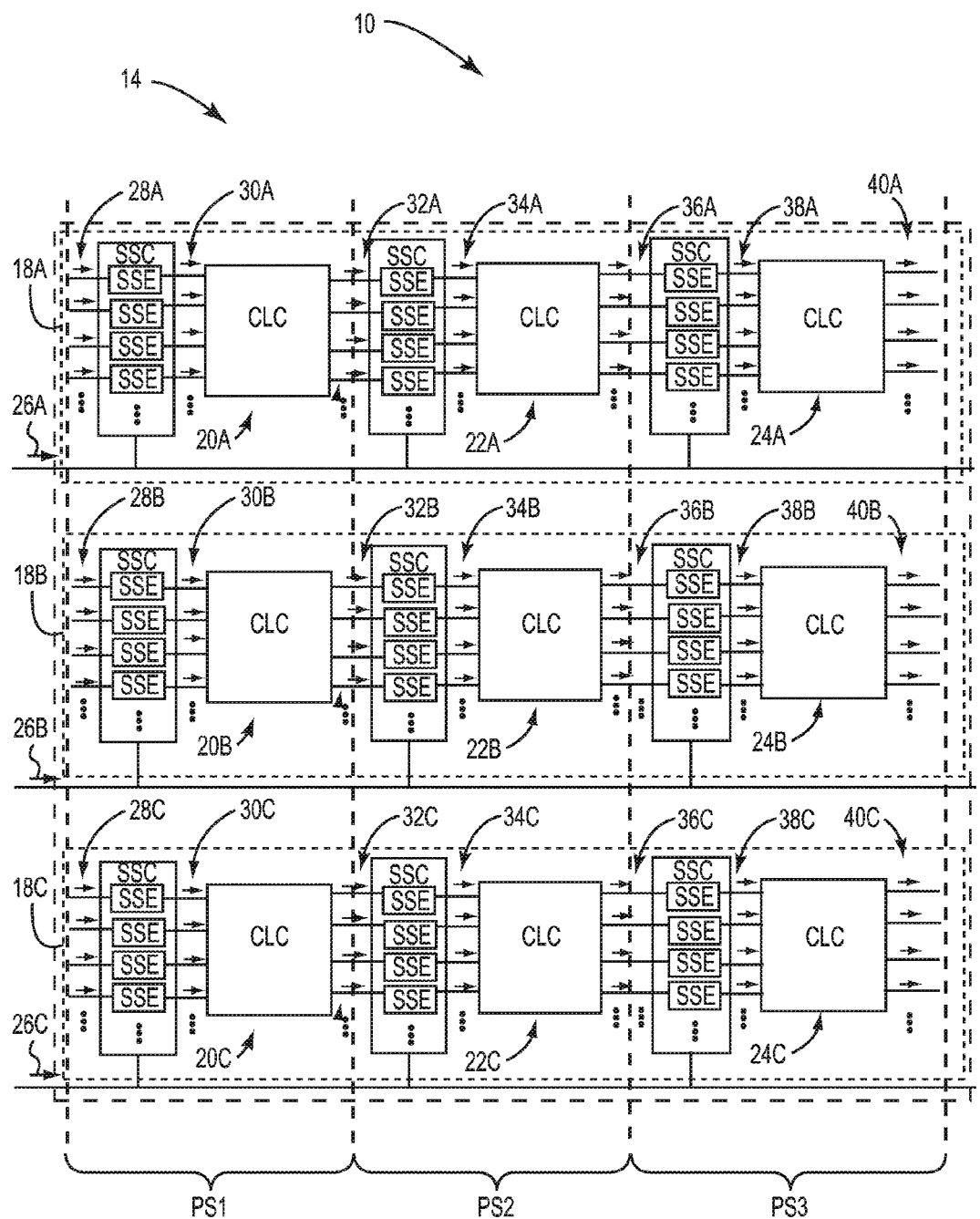
FIG. 1A illustrates a visual representation of one embodiment of an in silico multi-mode redundant (MMR) pipeline circuit provided in the in silico IC illustrated in FIG. 1, which in this embodiment is an in silico triple mode redundant (TMR) pipeline circuit.
Figure 1B:
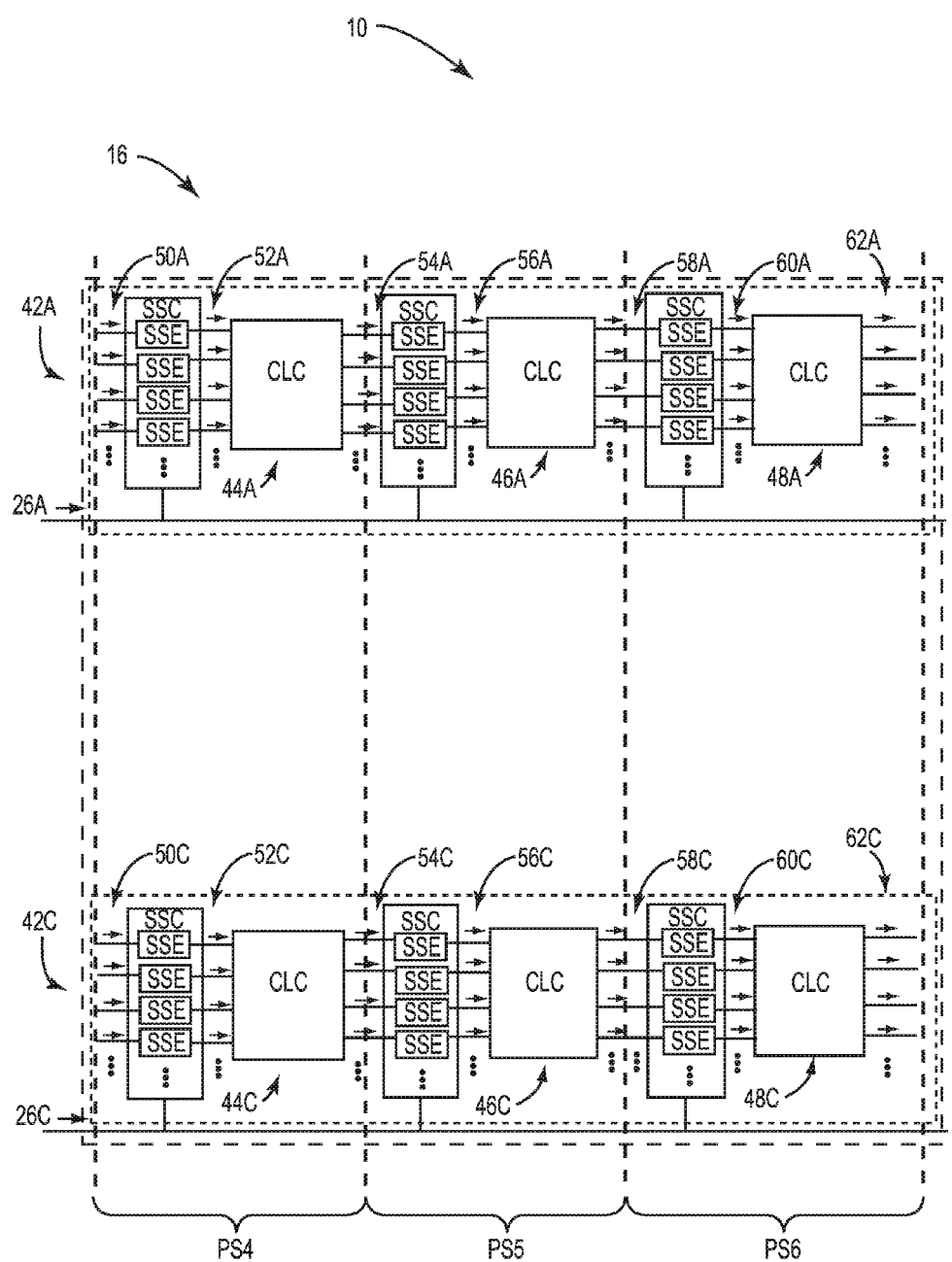
FIG. 1B illustrates a visual representation of one embodiment of another in silico multi-mode redundant (MMR) pipeline circuit provided in the in silico IC illustrated in FIG. 1, which in this embodiment is an in silico dual mode redundant (DMR) pipeline circuit.
Figure 9:
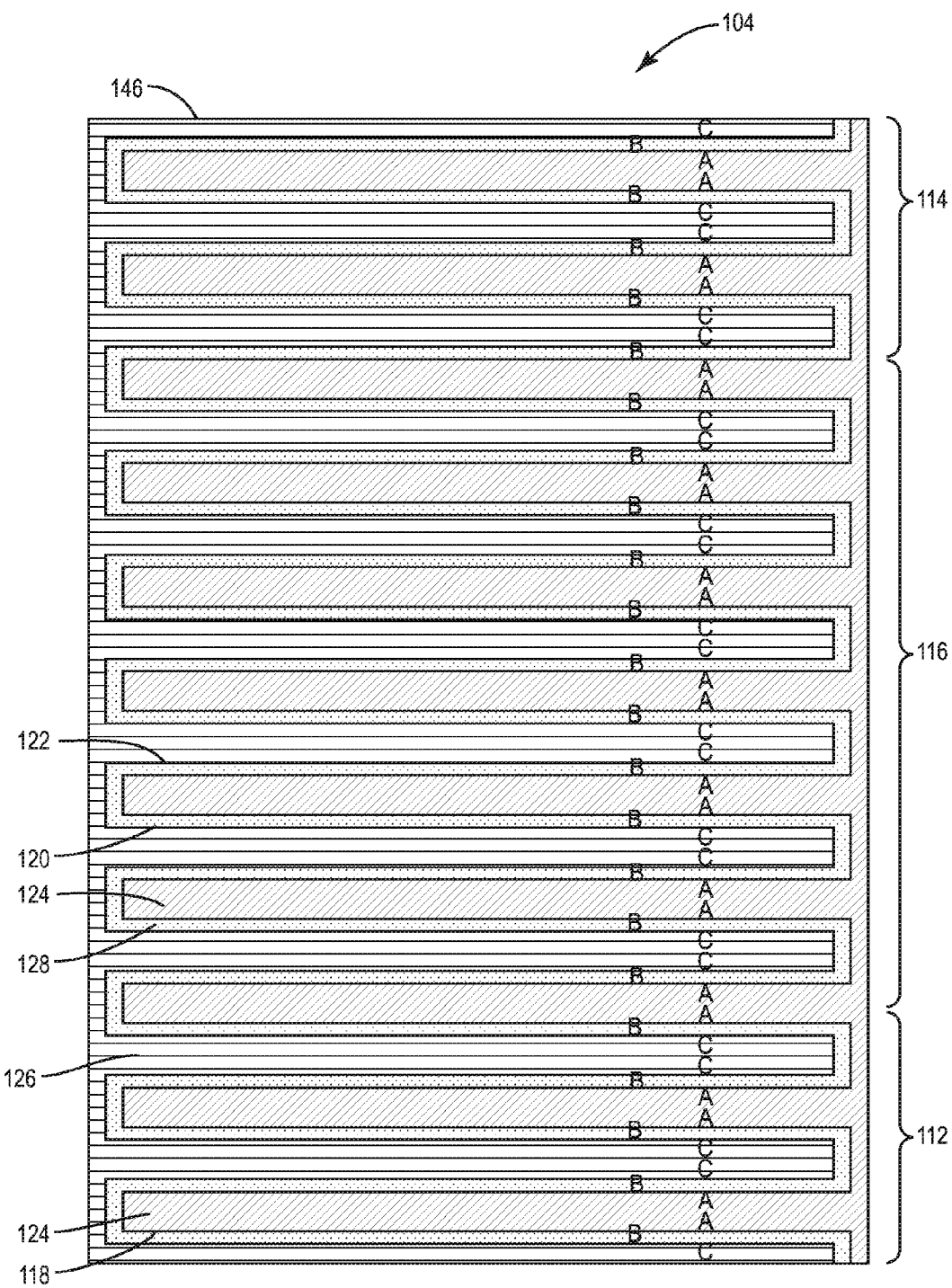

FIG. 9 illustrates one embodiment of an IC layout before placement having a floorplan that defines interleaved regions for placing the in silico MMR pipeline circuit (i.e., the in silico TMR pipeline circuit) shown in FIG. 1A and the other in silico MMR pipeline circuit provided by the in silico IC (i.e., the in silico DMR pipeline circuit) shown in FIG. 1B, where the interleaved regions are defined throughout the entire IC layout.

Figure 10:
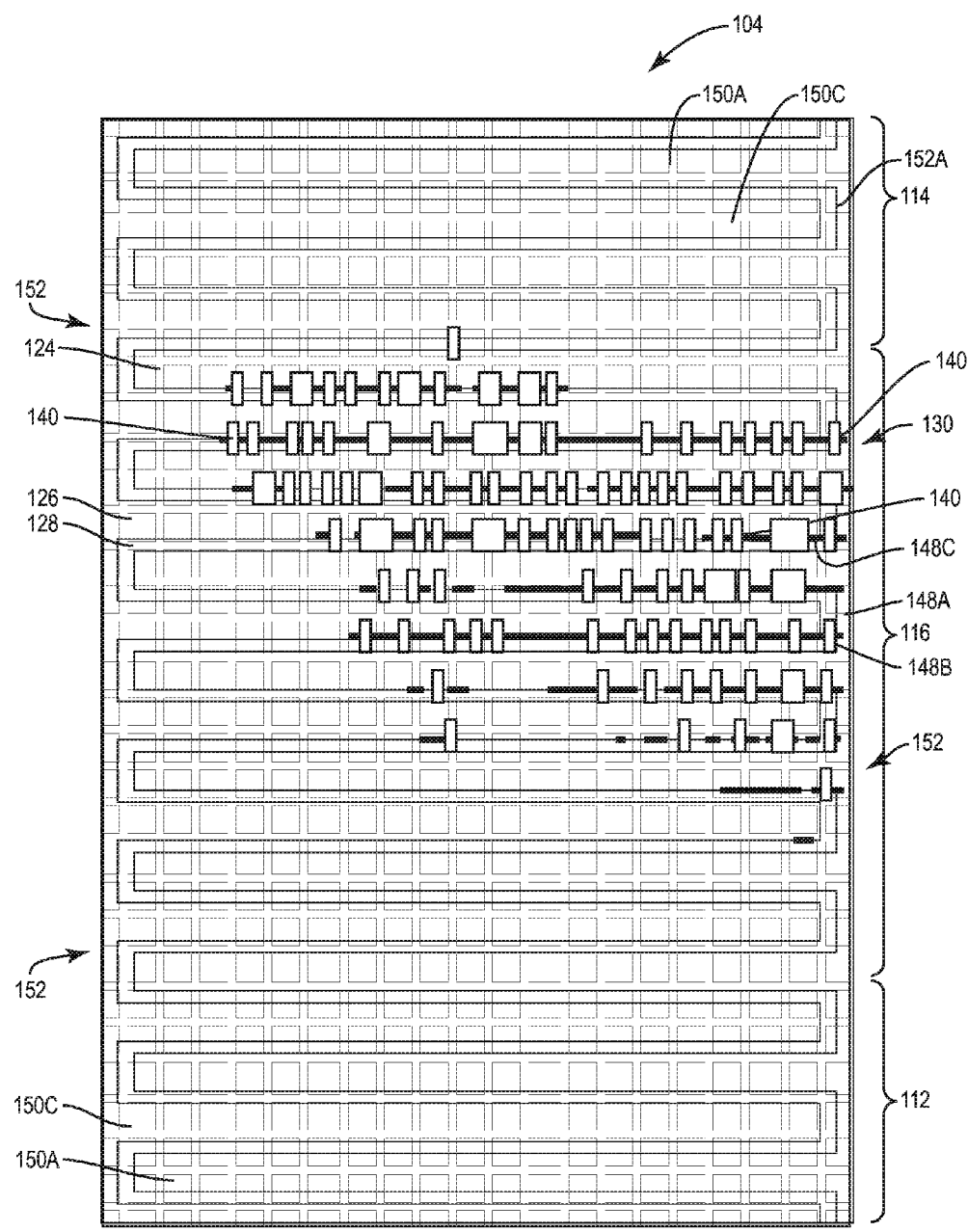

FIG. 10 illustrates one embodiment of the IC layout shown in FIG. 9 after final placement of MMR pipeline circuit layouts.

Figure 11:
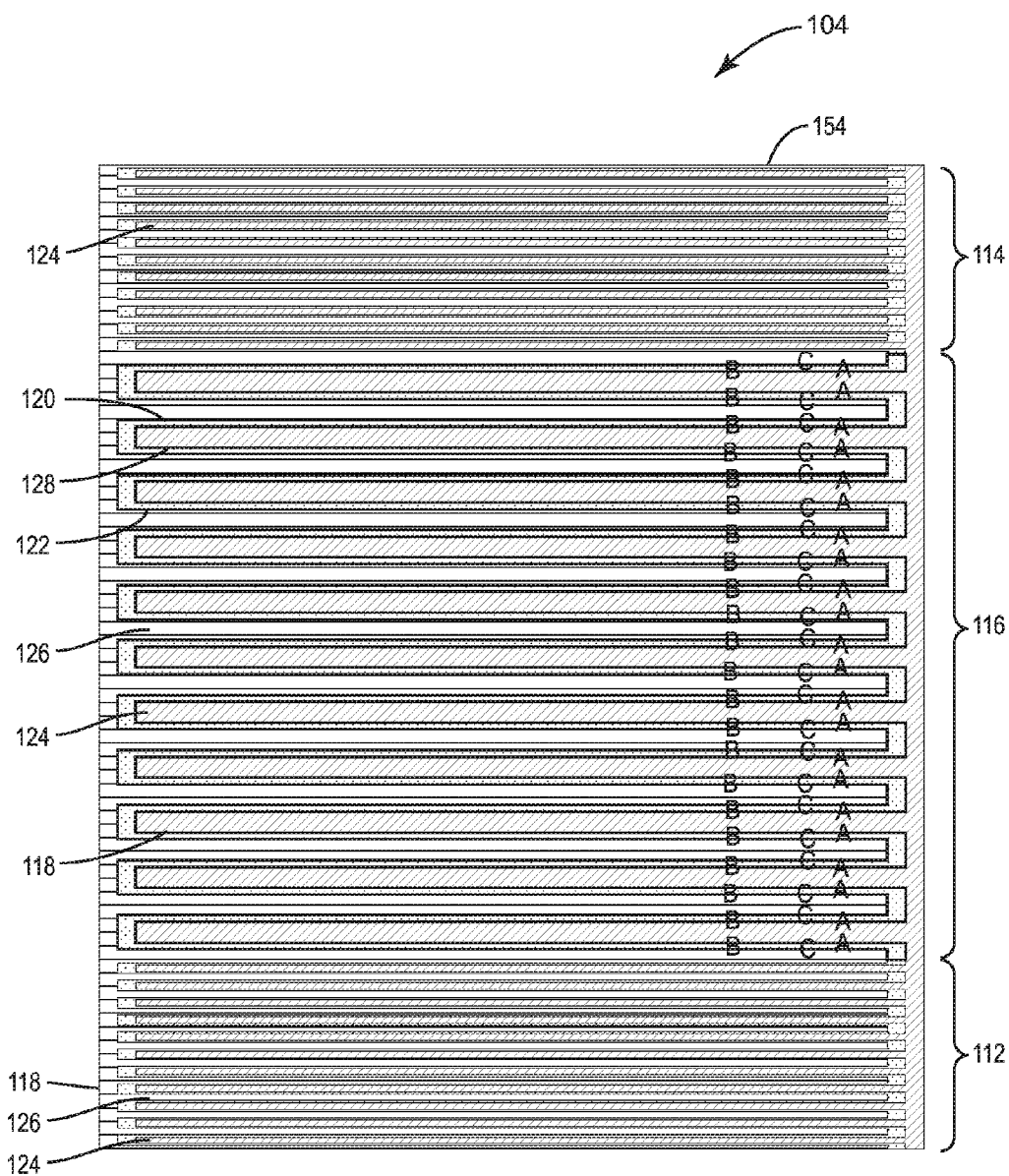

FIG. 11 illustrates one embodiment of an IC layout before placement having a floorplan that defines interleaved regions for placing the in silico MMR pipeline circuit (i.e., the in silico TMR pipeline circuit) shown in FIG. 1A and the other in silico MMR pipeline circuit (i.e., the in silico DMR pipeline circuit) shown in FIG. 1B, where only two of the interleaved regions are provided throughout the entire IC layout.

Figure 12:
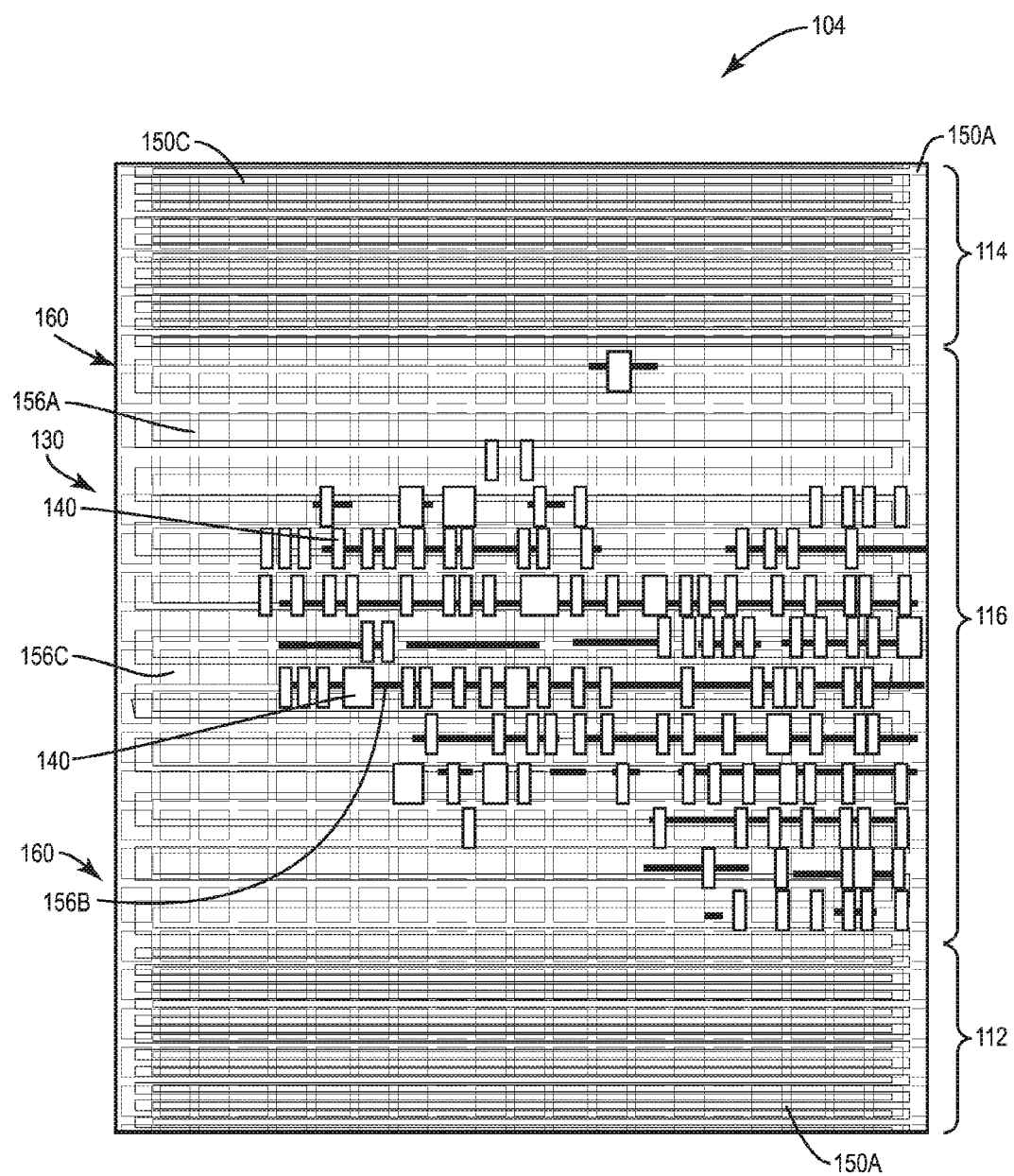

FIG. 12 illustrates one embodiment of the IC layout shown in FIG. 11 after final placement of the MMR pipeline circuit layouts.

Figure 13:
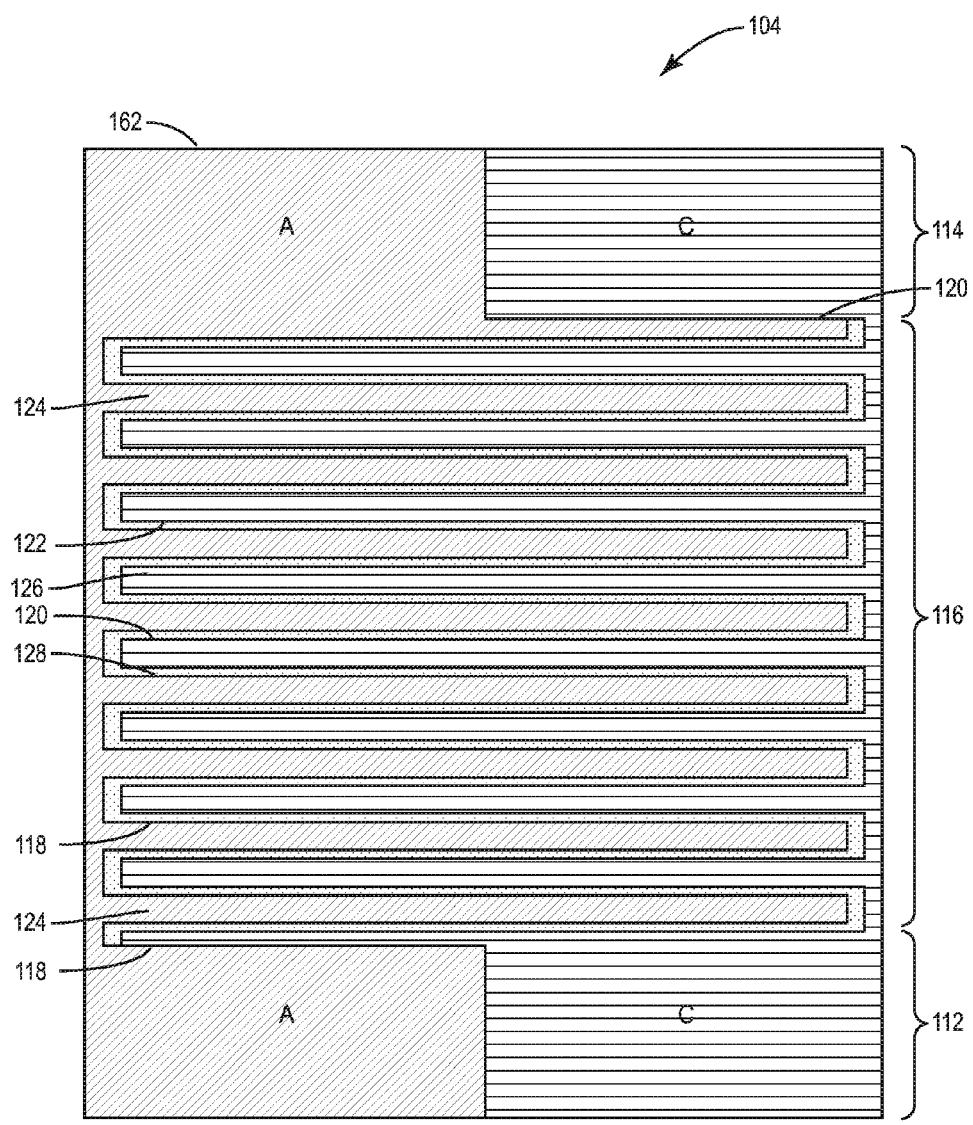

FIG. 13 illustrates one embodiment of an IC layout before placement and having a floorplan that defines interleaved regions for placing the in silico MMR pipeline circuit (i.e., the in silico TMR pipeline circuit) shown in FIG. 1A within the interleaved regions and four polygons for placing the other in silico MMR pipeline circuit (i.e., the in silico DMR pipeline circuit) shown in FIG. 1B.

Figure 14:
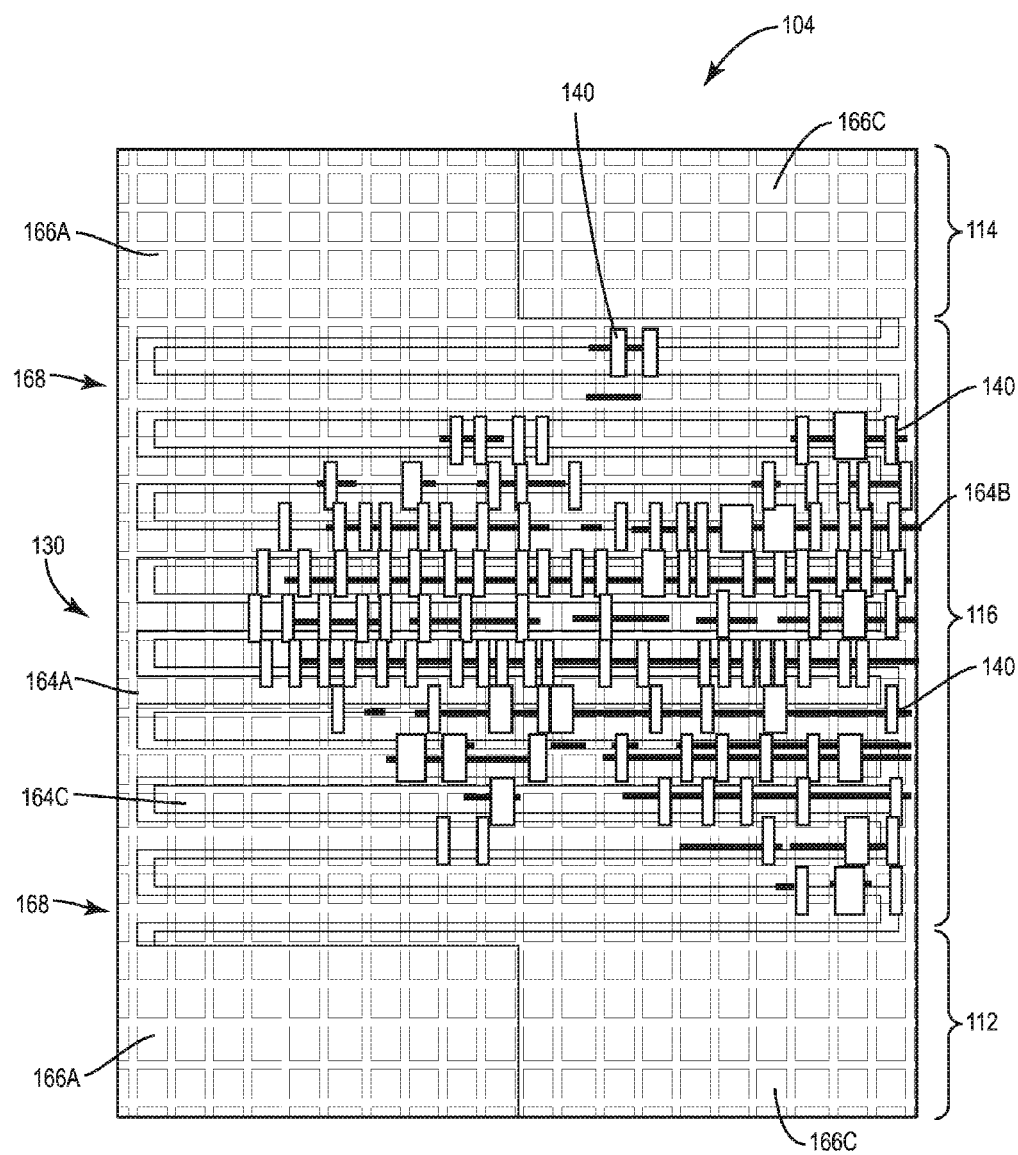

FIG. 14 illustrates one embodiment of the IC layout shown in FIG. 11 after final placement of MMR pipeline circuit layouts.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

When the term "in silico" is used as a qualifier throughout this disclosure, the term "in silico" is indicating that the referent qualified by "in silico" is a computer model of a physical object described by the referent. For example, an in silico integrated circuit (IC) is a computer model of an IC. The computer model can include one or more digital representations of the physical object described by the referent, including behavioral, functional, and/or physical representations. Thus, for instance, the in silico integrated circuit (IC) may include a behavioral representation (e.g., register transfer level (RTL) description), a functional representation (e.g., gate level netlist), and/or a physical representation (e.g., a physical circuit layout).

This disclosure relates generally to automated systems and methods that create IC layouts of in silico ICs. More specifically, embodiments of automated systems and methods are disclosed that produce in silico ICs with soft-error hardened designs. The in silico ICs may be and/or may have an in silico multi-mode redundant state machine (MMRSM) that includes one or more in silico multi-mode redundant (MMR) pipeline circuits. An in silico MMR pipeline circuit is a computer model of an MMR pipeline circuit. Thus, each of the in silico MMR pipeline circuits includes redundant in silico pipeline stages that operate approximately in parallel. One or more of the in silico MMR pipeline circuits may have a radiation hardened design so that the design protects against soft error events (e.g., single event transients (SETs) and/or single event upsets (SEU)) caused by high energy radiation. Using the techniques described herein, an electronic design automation (EDA) program can create an IC layout of the in silico IC that has a radiation hardened design but is still optimized. Thus, the IC layout will provide an MMR pipeline circuit layout(s) of an in silico MMR pipeline circuit(s) that provides the critical node spacing necessary for radiation hardened designs while allowing for placement optimization in the MMR pipeline circuit layout(s).

Furthermore, the techniques described herein allow for the in silico IC to have one or more in silico MMR pipeline circuits of any degree of modular redundancy and still provide critical node spacing and placement optimization. Thus, embodiments of the in silico IC may have multiple MMR pipeline circuits of mixed modular redundancy. Other embodiments of the in silico IC may have one or more in silico non-redundant pipeline circuits and one or more in silico MMR pipeline circuits of uniform or mixed redundancy. Additionally, embodiments of the in silico IC may have one or more in silico MMR pipeline circuits of uniform modular redundancy. By utilizing the techniques disclosed, an IC layout of the in silico IC can be created with the EDA program that is optimized regardless of the degrees of modular redundancy of the in silico MMR pipeline circuits provided by the in silico IC. The IC layout may then be utilized to generate a mask for semiconductor fabrication. A semiconductor foundry can then utilize the mask to create a physical IC with the physical architecture described by the IC layout and the IC design described by the in silico IC. The physical ICs will thus be radiation hardened.

The in silico IC may be generated using Computer Aided Design (CAD) such as Very-Large-Scale Integration (VLSI). Using the synthesis tools, the in silico IC is a computer model that behaviorally and functionally describes an IC. For example, after synthesis, the computer model may include a gate-level netlist that provides a description of logical gates that function in accordance with behavior described by an RTL description, which was compiled by the synthesis tools. VLSI provides an electronic design tool (e.g., automated place and route tools), which generates an IC layout based on the gate-level netlist. With respect to VLSI, the IC layout is an Application Specific Integrated Circuit (ASICs). As described in further detail below, the techniques described herein may utilize the automated place and route tools of VLSI to create the IC layout so that the IC layout is radiation hardened by design while being optimized spatially and temporally.

FIG. 1 pictorially illustrates a block diagram of one embodiment of an in silico IC 10 provided as an in silico MMRSM 12. The in silico IC 10 is a computer model of an IC provided as an MMRSM. In this embodiment, the in silico MMRSM 12 is of mixed modular redundancy. More specifically, the in silico MMRSM 12 includes an in silico triple mode redundant (TMR) pipeline circuit 14 and an in silico dual mode redundant (DMR) pipeline circuit 16. Thus, a modular redundancy of the in silico TMR pipeline circuit 14 is three (3), and a modular redundancy of the in silico DMR pipeline circuit 16 is two (2). As explained above, embodiments of the in silico IC 10 may include one or more in silico pipeline circuits of any degree of modular redundancy, and thus the in silico IC 10 is simply exemplary.

Referring now to FIG. 1 and FIG. 1A, FIG. 1A is a visual representation showing a more detailed embodiment of the in silico TMR pipeline circuit 14. The in silico TMR pipeline circuit 14 has three redundant in silico pipeline circuits (referred to generically with reference numeral 18 and individually as elements 18A-18C). Thus, the in silico pipeline circuit 18A, the in silico pipeline circuit 18B, and the in silico pipeline circuit 18C are redundant versions of a pipeline circuit and are thus functionally equivalent. However, they may or may not be identical. For example, one or more of the in silico pipeline circuits 18 may be logically inverted with respect to the in silico pipeline circuits 18. Each of the in silico pipeline circuits 18 is an in silico finite state machine. The operation of the in silico pipeline circuits 18 may be loosely analogized to an assembly line. More specifically, each of the in silico pipeline circuits 18 has in silico pipeline stages (referred to generically for each of the in silico pipeline circuits 18 as elements 20, 22, 24, and specifically for the individual in silico pipeline circuits 18 as elements 20A-20C, 22A-22C, and 24A-24C). In each of the in silico pipeline circuits 18, the different in silico pipeline stages 20, 22, 24 model a different operation of the in silico finite state machine so that the various operations of the particular in silico finite state machine are handled essentially in a series fashion. Examples of operations that may be modeled by the different in silico pipeline stages 20, 22, 24 for the particular finite state machines include instruction fetch operations, instruction decode operations, encode operations, register file operand fetch operations, instruction execution operations, data memory access operations, register file write back operations, and/or the like. Since the in silico TMR pipeline circuit 14 shown in FIG. 1A has three redundant in silico finite state machines, the in silico pipeline stage 20A of the in silico pipeline circuit 18A, the in silico pipeline stage 20B in the in silico pipeline circuit 18B, and the in silico pipeline stage 20C in the in silico pipeline circuit 18C are configured to model the same operation. Thus, the in silico pipeline stage 20A of the in silico pipeline circuit 18A, the in silico pipeline stage 20B in the in silico pipeline circuit 18B, and the in silico pipeline stage 20C in the in silico pipeline circuit 18C are components of a TMR pipeline stage PS1.

The in silico pipeline stage 22A of the in silico pipeline circuit 18A, the in silico pipeline stage 22B in the in silico pipeline circuit 18B, and the in silico pipeline stage 22C in the in silico pipeline circuit 18C are also configured to provide the model operation. Thus, the in silico pipeline stage 22A of the in silico pipeline circuit 18A, the in silico pipeline stage 22B in the in silico pipeline circuit 18B, and the in silico pipeline stage 22C in the in silico pipeline circuit 18C are components of a TMR pipeline stage PS2. Finally, the in silico pipeline stage 24A of the in silico pipeline circuit 18A, the in silico pipeline stage 24B in the in silico pipeline circuit 18B, and the in silico pipeline stage 24C in the in silico pipeline circuit 18C are also configured to provide the model operation. Thus, the in silico pipeline stage 24A of the in silico pipeline circuit 18A, the in silico pipeline stage 24B in the in silico pipeline circuit 18B, and the in silico pipeline stage 24C in the in silico pipeline circuit 18C are components of a TMR pipeline stage PS3.

As shown in FIG. 1A, the different in silico pipeline stages 20, 22, 24 of each of the in silico pipeline circuits 18 include in silico combinational logic circuits (CLCs) and in silico sequential state circuits (SSCs). In each of the in silico pipeline circuits 18, the in silico CLC of the different in silico pipeline stages 20, 22, 24 is specialized to model a particular operation of the particular in silico pipeline stages 20, 22, 24. Accordingly, for each of the in silico pipeline stages 20, 22, 24 in the in silico pipeline circuits 18, the in silico CLCs include an arrangement of combinational logic cells that represent combinational logic elements (i.e., logic gates). The combinational logic cells of the in silico CLCs thus are configured to provide logic that models the operation of combination logic elements and implement the operation of the in silico pipeline stage 20, 22, 24. Combinational logic cells that model static combinational logic elements and/or dynamic combinational logic elements may be utilized. While each of the in silico pipeline circuits 18 shown in FIG. 1A has three in silico pipeline stages 20, 22, 24, it should be noted that alternative embodiments of the in silico TMR pipeline circuit 14 may include any number of in silico pipeline stages. This may depend on the particular finite state machine to be provided by each of the in silico pipeline circuits 18 for a particular application.

To model the synchronization of the in silico pipeline stages 20, 22, 24 of each of the in silico pipeline circuits 18, the in silico SSCs coordinate transfer of valid states between the different in silico pipeline stages 20, 22, 24 in accordance with an modeled clock signal (referred to generically with reference numeral 26, and individually as elements 26A-26C). The modeled clock signal 26A received by the in silico pipeline circuit 18A, the modeled clock signal 26B received by the in silico pipeline circuit 18B, and the modeled clock signal 26C received by the in silico pipeline circuit 18C may be the same modeled clock signal 26 or a different modeled clock signal 26. This may depend, for example, on the modeled clock distribution technique used for the in silico MMRSM 12. It should be noted that in this particular embodiment, each of the in silico pipeline circuits 18 is assumed to model a single-phase clock style so that each of the in silico SSCs in the different in silico pipeline stages 20, 22, 24 receives a copy of the modeled clock signal 26 with the same timing. Alternatively, multiple-phase clock styles may be used. When multiple-phase clock styles are implemented, one or more of the in silico SSCs in the different in silico pipeline stages 20, 22, 24 may receive a different modeled clock signal, like the modeled clock signal 26, within each of the in silico pipeline circuits 18.

For each of the in silico pipeline circuits 18, the in silico SSC in the in silico pipeline stage 20 receives a modeled data input (referred to generically with reference numeral 28 and specifically with reference numerals 28A-28C). Based on the modeled data input 28 and in accordance with the modeled clock signal 26, the in silico SSC in the in silico pipeline stage 20 of each of the in silico pipeline circuits 18 generates a modeled data output (referred to generically with reference numeral 30 and specifically with reference numerals 30A-30C). In this embodiment, the modeled data input 28 for each of the in silico pipeline stages 20 models a plurality of input bit signals that provide the various bits of the modeled data input 28. Accordingly, the modeled data output 30 from the in silico SSC of each of the in silico pipeline stages 20 models a plurality of output bit signals that provide the various bits of the modeled data output 30. Multiple in silico SSEs are thus included in the in silico SSC of each of the in silico pipeline stages 20A, 20B, 20C.

More specifically, the in silico SSC in the in silico pipeline stage 20A provides in silico SSEs wherein each in silico SSE receives a corresponding modeled input bit signal of the modeled data input 28A and generates a corresponding modeled output bit signal of the modeled data output 30A. The in silico SSC in the in silico pipeline stage 20B provides in silico SSEs wherein each in silico SSE receives a corresponding modeled input bit signal of the modeled data input 28B and generates a corresponding modeled output bit signal of the modeled data output 30B. The in silico SSC in the in silico pipeline stage 20C provides in silico SSEs wherein each in silico SSE receives a corresponding modeled input bit signal of the modeled data input 28C and generates a corresponding modeled output bit signal of the modeled data output 30C. With regard to the in silico TMR pipeline stage PS1, the in silico CLCs of each of the in silico pipeline stages 20 perform the designated pipeline operation in accordance with their logical arrangement in parallel and generate a modeled data input (referred to generically with reference numeral 32 and specifically with reference numerals 32A-32C) for each of the next in silico pipeline stages 22. As discussed above, the designated pipeline operation is redundant.

The in silico SSCs of the TMR pipeline stage PS1 are arranged in accordance with in silico triple mode redundant self-correcting sequential state elements (TMRSCSSE). Thus, for each of the SSCs of the in silico TMR pipeline stage PS1, a corresponding one of the in silico SSEs in the in silico pipeline stage 20A, a corresponding one of the in silico SSEs in the in silico pipeline stage 20B, and a corresponding one of the in silico SSEs in the in silico pipeline stage 20C are connected to provide majority voter correction. In this manner, a soft error resulting in an incorrect bit state in the in silico SSE of one of the in silico pipeline stages 20 would be self-corrected by the bit states stored in the in silico SSEs of the other two in silico pipeline stages. The majority voter correction of the in silico TMRSCSSEs thus provides protection against soft error events (e.g., single event transients (SETs) and/or single event upsets (SEU)) caused by high energy radiation. Exemplary arrangements for the in silico TMRSCSSEs are disclosed in U.S. patent application Ser. No. 13/487,859, entitled "Structures and Methods For Design Automation of Radiation Hardened Triple Mode Redundant Digital Circuits," filed on Jun. 4, 2012, which is hereby incorporated in its entirety by reference.

With regard to the in silico TMR pipeline stage PS2, for each of the in silico pipeline circuits 18, the in silico SSC in the in silico pipeline stage 22 receives a corresponding one of the modeled data inputs 32A-32C from the in silico pipeline stages 20. Based on the modeled data input 32 and in accordance with the modeled clock signal 26, the in silico SSC in the in silico pipeline stage 22 of each of the in silico pipeline circuits 18 generates a modeled data output (referred to generically with reference numeral 34 and specifically with reference numerals 34A-34C).

More specifically, the in silico SSC in the in silico pipeline stage 22A provides in silico SSEs wherein each in silico SSE receives a corresponding modeled input bit signal of the modeled data input 32A and generates a corresponding modeled output bit signal of the modeled data output 34A. The in silico SSC in the in silico pipeline stage 22B provides in silico SSEs wherein each in silico SSE receives a corresponding modeled input bit signal of the modeled data input 32B and generates a corresponding modeled output bit signal of the modeled data output 34B. The in silico SSC in the in silico pipeline stage 22C provides in silico SSEs wherein each in silico SSE receives a corresponding modeled input bit signal of the modeled data input 32C and generates a corresponding modeled output bit signal of the modeled data output 34C. With regard to the in silico TMR pipeline stage PS2, the in silico CLCs of each of the in silico pipeline stages 22 perform the designated pipeline operation in accordance with their logical arrangement in parallel and generate a modeled data input (referred to generically with reference numeral 36 and specifically with reference numerals 36A-36C) for each of the next in silico pipeline stages 24. As discussed above, the designated pipeline operation is redundant.

The in silico SSCs of the TMR pipeline stage PS2 are arranged in accordance with in silico TMRSCSSE. Thus, for each of the SSCs of the in silico TMR pipeline stage PS2, a corresponding one of the in silico SSEs in the in silico pipeline stage 22A, a corresponding one of the in silico SSEs in the in silico pipeline stage 22B, and a corresponding one of the in silico SSEs in the in silico pipeline stage 22C are connected to provide majority voter correction. In this manner, a soft error resulting in an incorrect bit state in the in silico SSE of one of the in silico pipeline stages 22 would be self-corrected by the bit states stored in the in silico SSEs of the other two in silico pipeline stages. The majority voter correction of the in silico TMRSCSSEs thus provides protection against SETs and SEUs caused by high energy radiation. Exemplary arrangements for the in silico TMRSCSSEs are disclosed in U.S. patent application Ser. No. 13/487,859, entitled "Structures and Methods For Design Automation of Radiation Hardened Triple Mode Redundant Digital Circuits," filed on Jun. 4, 2012.

With regard to the in silico TMR pipeline stage PS3, for each of the in silico pipeline circuits 18, the in silico SSC in the in silico pipeline stage 24 receives a corresponding one of the modeled data inputs 36A-36C from the in silico pipeline stages 22. Based on the modeled data input 36 and in accordance with the modeled clock signal 26, the in silico SSC in the in silico pipeline stage 24 of each of the in silico pipeline circuits 18 generates a modeled data output (referred to generically with reference numeral 38 and specifically with reference numerals 38A-38C).

More specifically, the in silico SSC in the in silico pipeline stage 24A provides in silico SSEs wherein each in silico SSE receives a corresponding modeled input bit signal of the modeled data input 36A and generates a corresponding modeled output bit signal of the modeled data output 38A. The in silico SSC in the in silico pipeline stage 24B provides in silico SSEs wherein each in silico SSE receives a corresponding modeled input bit signal of the modeled data input 36B and generates a corresponding modeled output bit signal of the modeled data output 38B. The in silico SSC in the in silico pipeline stage 24C provides in silico SSEs wherein each in silico SSE receives a corresponding modeled input bit signal of the modeled data input 36C and generates a corresponding modeled output bit signal of the modeled data output 38C. With regard to the in silico TMR pipeline stage PS3, the in silico CLCs of each of the in silico pipeline stages 24 perform the designated pipeline operation in accordance with their logical arrangement in parallel and generate a modeled data input (referred to generically with reference numeral 40 and specifically with reference numerals 40A-40C) for each of the next pipeline stages (not explicitly shown). As discussed above, the designated pipeline operation is redundant.

The in silico SSCs of the TMR pipeline stage PS3 are arranged in accordance with in silico TMRSCSSE. Thus, for each of the SSCs of the in silico TMR pipeline stage PS3, a corresponding one of the in silico SSEs in the in silico pipeline stage 24A, a corresponding one of the in silico SSEs in the in silico pipeline stage 24B, and a corresponding one of the in silico SSEs in the in silico pipeline stage 24C are connected to provide majority voter correction. In this manner, a soft error resulting in an incorrect bit state in the in silico SSE of one of the in silico pipeline stages 24 would be self-corrected by the bit states stored in the in silico SSEs of the other two in silico pipeline stages. The majority voter correction of the in silico TMRSCSSEs thus provides protection against SETs and SEUs caused by high energy radiation. Exemplary arrangements for the in silico TMRSCSSEs are disclosed in U.S. patent application Ser. No. 13/487,859, entitled "Structures and Methods For Design Automation of Radiation Hardened Triple Mode Redundant Digital Circuits," filed on Jun. 4, 2012.

Referring now to FIG. 1 and FIG. 1B, FIG. 1B is a visual representation showing a more detailed embodiment of the in silico DMR pipeline circuit 16. In the in silico DMR pipeline circuit 16, there are two redundant in silico pipeline circuits (referred to generically with reference numeral 42 and individually as elements 42A, 42C). Thus, the in silico pipeline circuit 42A and the in silico pipeline circuit 42C are redundant versions of a pipeline circuit and are thus functionally equivalent. However, they may or may not be identical. For example, one or more of the in silico pipeline circuits 42 may be logically inverted with respect to the in silico pipeline circuits 42. Each of the in silico pipeline circuits 42 is an in silico finite state machine. The operation of the in silico pipeline circuits 42 may be loosely analogized to an assembly line. More specifically, each of the in silico pipeline circuits 42 has in silico pipeline stages (referred to generically for each of the in silico pipeline circuits 42 as elements 44, 46, 48, and specifically for the individual in silico pipeline circuits 42 as elements 44A, 44C, 46A, 46C, and 48A, 48C). In each of the in silico pipeline circuits 42, the different in silico pipeline stages 44, 46, 48 model a different operation of the in silico finite state machine so that the various operations of the particular in silico finite state machine are handled essentially in a series fashion. Examples of operations that may be modeled by the different in silico pipeline stages 44, 46, 48 for the particular finite state machines include instruction fetch operations, instruction decode operations, encode operations, register file operand fetch operations, instruction execution operations, data memory access operations, register file write back operations, and/or the like. Since the in silico DMR pipeline circuit 16 shown in FIG. 1B has two redundant in silico finite state machines, the in silico pipeline stage 44A of the in silico pipeline circuit 42A and the in silico pipeline stage 44C in the in silico pipeline circuit 42C are configured to model the same operation. Thus, the in silico pipeline stage 44A of the in silico pipeline circuit 42A and the in silico pipeline stage 44C in the in silico pipeline circuit 42C are a DMR pipeline stage PS4.

The in silico pipeline stage 46A of the in silico pipeline circuit 42A and the in silico pipeline stage 46C in the in silico pipeline circuit 42C are also configured to provide the model operation. Thus, the in silico pipeline stage 46A of the in silico pipeline circuit 42A and the in silico pipeline stage 46C in the in silico pipeline circuit 42C are a DMR pipeline stage PS5. Finally, the in silico pipeline stage 48A of the in silico pipeline circuit 42A and the in silico pipeline stage 48C in the in silico pipeline circuit 42C are also configured to provide the model operation. Thus, the in silico pipeline stage 48A of the in silico pipeline circuit 42A and the in silico pipeline stage 48C in the in silico pipeline circuit 42C are a DMR pipeline stage PS6.

As shown in FIG. 1B, the different in silico pipeline stages 44, 46, 48 of each of the in silico pipeline circuits 42 include in silico CLCs and in silico SSCs. In each of the in silico pipeline circuits 42, the in silico CLC of the different in silico pipeline stages 44, 46, 48 is specialized to model a particular operation of the particular in silico pipeline stage 44, 46, 48. Accordingly, for each of the in silico pipeline stages 44, 46, 48 in the in silico pipeline circuits 42, the in silico CLCs include an arrangement of combinational logic cells that represent combinational logic elements (i.e., logic gates). The combinational logic cells of the in silico CLCs thus are configured to provide logic that models the operation of combination logic elements and implements the operation of the in silico pipeline stage 44, 46, 48. Combinational logic cells that model static combinational logic elements and/or dynamic combinational logic elements may be utilized. While each of the in silico pipeline circuits 42 shown in FIG. 1B has three in silico pipeline stages 44, 46, 48, it should be noted that alternative embodiments of the in silico pipeline circuit 42 may include any number of in silico pipeline stages. This may depend on the particular finite state machine to be provided by each of the in silico pipeline circuits 42 for a particular application.

To model the synchronization of the in silico pipeline stages 44, 46, 48 of each of the in silico pipeline circuits 42, the in silico SSCs coordinate transfer of valid states between the different in silico pipeline stages 44, 46, 48 in accordance with a corresponding one of the modeled clock signals 26A, 26C. The modeled clock signal 26A received by the in silico pipeline circuit 42A and the modeled clock signal 26C received by the in silico pipeline circuit 42C may be the same modeled clock signal 26 or a different modeled clock signal 26. This may depend, for example, on the modeled clock distribution technique used for the in silico MMRSM 12. It should be noted that in this particular embodiment, each of the in silico pipeline circuits 42 is assumed to model a single-phase clock style so that each of the in silico SSCs in the different in silico pipeline stages 44, 46, 48 receives a copy of the modeled clock signal 26 with the same timing. Alternatively, multiple-phase clock styles may be used. When multiple-phase clock styles are implemented, one or more of the in silico SSCs in the different in silico pipeline stages 44, 46, 48 may receive a different modeled clock signal, like the modeled clock signal 26, within each of the in silico pipeline circuits 42.

For each of the in silico pipeline circuits 42, the in silico SSC in the in silico pipeline stage 44 receives a modeled data input (referred to generically with reference numeral 50 and specifically with reference numerals 50A, 50C). Based on the modeled data input 50 and in accordance with the modeled clock signal 26, the in silico SSC in the in silico pipeline stage 44 of each of the in silico pipeline circuits 42 generates a modeled data output (referred to generically with reference numeral 52 and specifically with reference numerals 52A, 52C). In this embodiment, the modeled data input 50 for each of the in silico pipeline stages 44 models a plurality of input bit signals that provide the various bits of the modeled data input 50. Accordingly, the modeled data output 52 from the in silico SSC of each of the in silico pipeline stages 44 models a plurality of output bit signals that provide the various bits of the modeled data output 52. Multiple in silico SSEs are thus included in the in silico SSC of each of the in silico pipeline stages 44A, 44C.

More specifically, the in silico SSC in the in silico pipeline stage 44A provides in silico SSEs wherein each in silico SSE receives a corresponding modeled input bit signal of the modeled data input 50A and generates a corresponding modeled output bit signal of the modeled data output 52A. The in silico SSC in the in silico pipeline stage 44C provides in silico SSEs wherein each in silico SSE receives a corresponding modeled input bit signal of the modeled data input 50C and generates a corresponding modeled output bit signal of the modeled data output 52C. With regard to the in silico DMR pipeline stage PS4, the in silico CLCs of each of the in silico pipeline stages 44 perform the designated pipeline operation in accordance with their logical arrangement in parallel and generate a modeled data input (referred to generically with reference numeral 54 and specifically with reference numerals 54A, 54C) for each of the next in silico pipeline stages 46. As discussed above, the designated pipeline operation is redundant.

The in silico SSCs of the DMR pipeline stage PS4 are not self-correcting through majority voter correction. Rather, DMR techniques are utilized in the in silico DMR pipeline circuit 16 to detect errors and provide correction. With regard to the in silico DMR pipeline stage PS5, for each of the in silico pipeline circuits 42, the in silico SSC in the in silico pipeline stage 46 receives a corresponding one of the modeled data inputs 54A, 54C from the in silico pipeline stages 44. Based on the modeled data input 54 and in accordance with the modeled clock signal 26, the in silico SSC in the in silico pipeline stage 46 of each of the in silico pipeline circuits 42 generates a modeled data output (referred to generically with reference numeral 56 and specifically with reference numerals 56A, 56C).

More specifically, the in silico SSC in the in silico pipeline stage 46A provides in silico SSEs wherein each in silico SSE receives a corresponding modeled input bit signal of the modeled data input 54A and generates a corresponding modeled output bit signal of the modeled data output 56A. The in silico SSC in the in silico pipeline stage 46C provides in silico SSEs wherein each in silico SSE receives a corresponding modeled input bit signal of the modeled data input 54C and generates a corresponding modeled output bit signal of the modeled data output 56C. With regard to the in silico DMR pipeline stage PS5, the in silico CLCs of each of the in silico pipeline stages 46 perform the designated pipeline operation in accordance with their logical arrangement in parallel and generate a modeled data input (referred to generically with reference numeral 58 and specifically with reference numerals 58A, 58C) for each of the next in silico pipeline stages 48. As discussed above, the designated pipeline operation is redundant. The in silico SSCs of the DMR pipeline stage PS5 are arranged, not self-correcting through majority voting. Rather, DMR techniques are used to detect and correct errors.

With regard to the in silico DMR pipeline stage PS6, for each of the in silico pipeline circuits 42, the in silico SSC in the in silico pipeline stage 48 receives a corresponding one of the modeled data inputs 58A, 58C from the in silico pipeline stages 46. Based on the modeled data input 58 and in accordance with the modeled clock signal 26, the in silico SSC in the in silico pipeline stage 48 of each of the in silico pipeline circuits 42 generates a modeled data output (referred to generically with reference numeral 60 and specifically with reference numerals 60A, 60C).

More specifically, the in silico SSC in the in silico pipeline stage 48A provides in silico SSEs wherein each in silico SSE receives a corresponding modeled input bit signal of the modeled data input 58A and generates a corresponding modeled output bit signal of the modeled data output 60A. The in silico SSC in the in silico pipeline stage 48C provides in silico SSEs wherein each in silico SSE receives a corresponding modeled input bit signal of the modeled data input 58C and generates a corresponding modeled output bit signal of the modeled data output 60C. With regard to the in silico DMR pipeline stage PS6, the in silico CLCs of each of the in silico pipeline stages 48 perform the designated pipeline operation in accordance with their logical arrangement in parallel and generate a modeled data input (referred to generically with reference numeral 62 and specifically with reference numerals 62A, 62C). As discussed above, the designated pipeline operation is redundant. The in silico SSCs of the DMR pipeline stage PS6 are not self-correcting through majority voting, but rather DMR techniques are utilized to detect and correct errors.

Referring now to FIGS. 1, 1A, and 1B, an in silico modular redundancy interface 64 is provided in the in silico IC 10, which is operably associated with the in silico TMR pipeline circuit 14 and the in silico DMR pipeline circuit 16. The in silico modular redundancy interface 64 is configured to provide a redundancy conversion so that the in silico MMRSM 12 is able to communicate between DMR domains. Accordingly, the modeled data inputs 28, 32, 36, 40, 50, 54, 58, 62 and modeled data outputs 30, 34, 38, 52, 56, 60 can be communicated between the in silico TMR pipeline circuit 14 and the in silico DMR pipeline circuit 16. In this manner, the overall in silico MMRSM 12 is radiation hardened by the majority correction provided by the in silico TMR pipeline circuit 14. Since DMR circuits cannot self-correct by voting, there is no need to agglomerate the DMR SSEs, i.e., DMR SSEs are not grouped. Their placement must simply conform to the correct layout boundaries.

At this stage, the in silico IC 10 is assumed to be modeled behaviorally and functionally but not physically. Thus, the in silico IC 10 currently includes a gate-level netlist and other ancillary data used to functionally model the in silico IC 10 at the gate level after logical synthesis. The gate-level netlist includes logical gate cells providing the in silico CLCs of the in silico TMR pipeline circuit 14, the in silico DMR pipeline circuit 16, and the in silico modular redundancy interface 64. Additionally, SSE layouts functionally model the in silico SSEs of the in silico TMR pipeline circuit 14, the in silico DMR pipeline circuit 16, and the in silico modular redundancy interface 64. The described techniques in this disclosure allow for a physical representation of the in silico IC 10 to be generated using EDA programs.

However, note that the majority vote self-correction mechanism of the in silico TMRSCSSEs in the in silico TMR pipeline circuit 14 is predicated on the assumption that a radiation strike won't be able to simultaneously introduce incorrect bit states in two of three majority voted in silico SSEs. To do this, the in silico TMRSCSSEs need to be physically modeled such that adequate spatial separation is provided between critical nodes. In this manner, the physical model prevents a radiation strike from simultaneously resulting in more than one incorrect bit state thereby defeating the TMR self-correcting mechanism. However, electronic automated design tools used to generate IC layouts tend to create arrangements which minimize area. While this optimization is beneficial, it can result in IC layouts with inadequate spacing between critical nodes. The systems and methods described herein allow for an IC layout of an in silico IC, such as the in silico IC 10 described in FIGS. 1, 1A, and 1B to be generated with electronic automated design tools while maintain critical node spacing. The techniques can also be utilized to generate an IC layout of an in silico IC having an in silico MMRSM with mixed modular redundancy, such as the in silico MMRSM 12 shown in FIGS. 1, 1A, and 1B.

Figure 2:
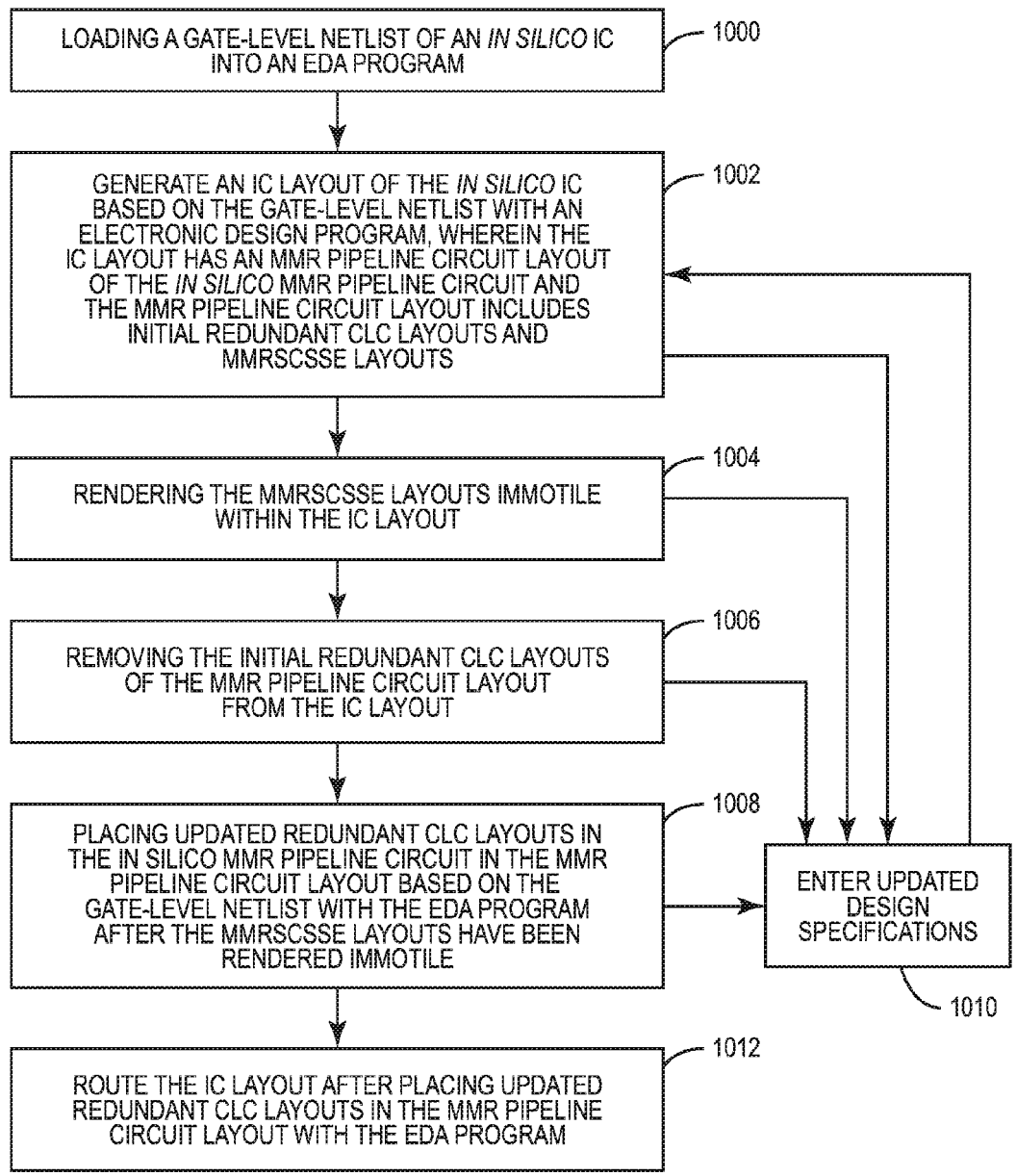
FIG. 2 is a flow chart that illustrates exemplary procedures in a computer implemented method for producing a physical representation of the in silico IC shown in FIG. 1.

FIG. 2 illustrates exemplary procedures of a computer implemented method of producing a physical representation of an in silico IC having at least one in silico MMR pipeline circuit. In particular, the exemplary procedures can be used to create an IC layout of an in silico IC with an EDA program implemented by an electronic computational system. The exemplary procedures allow the EDA program to optimize the IC layout while maintaining critical node spacing. Furthermore, the exemplary procedures also allow for IC layouts to be created with IC layouts having in silico MMR pipeline circuits of mixed modular redundancy, such as the in silico IC 10 shown in FIGS. 1, 1A, and 1B, or having one or more in silico MMR pipeline circuits and one or more non-redundant pipeline circuits.

As shown in FIG. 2, an electronic computational system loads a gate-level netlist of an in silico IC into a EDA program (procedure 1000). With respect to the in silico IC 10 shown in FIG. 1, the electronic computational system may load the gate-level netlist of the in silico IC 10 into the EDA program. Other data characterizing the in silico IC 10 may also be loaded into the EDA program, such as timing constraints, libraries, and design parameters, and the like.

The electronic computational system generates an IC layout of the in silico IC based on the gate-level netlist with the EDA program, wherein the IC layout has an MMR pipeline circuit layout of the in silico MMR pipeline circuit and the MMR pipeline circuit layout includes initial redundant CLC layouts and MMRSCSSE layouts (procedure 1002). The electronic computation system generates the MMR pipeline circuit layout is automated using placement algorithms provided by the EDA program. Thus, with respect to the in silico IC 10 shown in FIG. 1, the electronic computational system generates an IC layout of the in silico IC 10 based on the gate-level netlist with the EDA program. The IC layout includes a TMR pipeline circuit layout of the in silico TMR pipeline circuit 14. The TMR pipeline circuit layout has initial redundant CLC layouts of each of the in silico CLCs (shown in FIG. 1) of the in silico pipeline circuits 18A, 18B, and 18C (shown in FIG. 1). The TMR pipeline circuit layout also has MMRSCSSE layouts of each of the in silico MMRSCSSEs (shown in FIG. 1A as redundant combinations of in silico SSEs provided by the in silico SSCs of each of the in silico redundant pipeline stages, PS1, PS2, PS3). The MMRSCSSE layouts have an architecture that provides critical node spacing between SSE layouts.

Note that in addition, the in silico IC may include one or more other in silico pipeline circuits. For example, the in silico IC may include an additional in silico MMR pipeline circuit of a different modular redundancy, including single, i.e., non-redundant. Thus, the electronic computational system generates the IC layout of the in silico IC to include another initial MMR pipeline circuit layout of the other in silico MMR pipeline circuit. This other initial MMR pipeline circuit layout includes initial redundant CLC layouts and SSE layouts of the other in silico MMR pipeline circuit. The electronic computation system generates the other MMR pipeline circuit layout is automated using placement algorithms provided by the EDA program. Additionally or alternatively, the electronic computational system would thus generate the IC layout of the in silico IC to include a non-redundant pipeline circuit layout of the non-redundant in silico pipeline circuit.

With respect to the in silico IC 10 shown in FIGS. 1, 1A, and 1B, the electronic computational system generates the IC layout to include a DMR pipeline circuit layout of the in silico DMR pipeline circuit 16. The DMR pipeline circuit layout has initial redundant CLC layouts of each of the in silico CLCs (shown in FIG. 1B) of the in silico pipeline circuits 42A and 42C (shown in FIG. 1B). The DMR pipeline circuit layout also has initial SSE layouts of each of the in silico SSEs provided by the in silico SSCs of each of the in silico redundant pipeline stages, PS4, PS5, PS6. Other components may also be initially placed. For example, the electronic computational system generates the IC layout to include an initial circuit layout of the in silico modular redundancy interface 64.

At this point, the CLC cells of the redundant CLC layouts of the MMR pipeline circuit layout may be placed too close to in silico circuits of another redundant group or adjacent to the wrong redundant group of in silico MMRSCSSEs, and thereby compromise critical node spacing (whereby a single ionizing particle can affect both domains). For example, CLC cells of the redundant CLC layouts of the TMR pipeline circuit layout may be placed too close to the SSE layouts of the MMRSCSSE layouts of a different in silico pipeline circuit, i.e., A adjacent to B. These CLC cells should be replaced to provide critical node spacing. However, this correction needs to be done without affecting the MMRSCSSE layouts, since the critical node spacing provided by the architecture of the MMRSSCSSE layouts can become compromised, and the MMRSCSSE placements at this point conform to the correct layout boundaries.

Accordingly, the electronic computational system renders the MMRSCSSE layouts immotile within the IC layout (procedure 1004). As such, the MMRSCSSE layouts are fixed within the IC layout and cannot be unplaced by the EDA program. This prevents SSE layouts in the MMRSCSSE layouts from being moved and freezes the topology of the MMRSCSSE, thereby preserving critical node spacing when the in silico CLC cells are subsequently placed within the correct layout boundaries. With regards to the IC layout of the in silico IC 10, the electronic computational system renders the TMRSCSSE layouts immotile. As such, the TMRSCSSE layouts in the TMR pipeline circuit layout of the in silico TMR pipeline circuit 14 are fixed and cannot be relocated within the IC layout. A topology of the TMRSCSSE layouts is frozen to preserve critical node spacing.

The electronic computational system then removes the initial redundant CLC layouts of the MMR pipeline circuit layout from the IC layout (procedure 1006). This is because the initial redundant CLC layouts may not be in the correct boundaries (as the boundary restrictions at this point are soft and may be violated by the placement tool. If there are other initial MMR pipeline circuit layouts of other in silico MMR pipeline circuits and/or initial non-redundant pipeline circuit layouts of in silico non-redundant pipeline circuits that do not utilize in silico MMRSCSSEs, the electronic computation system removes the other initial MMR pipeline circuit layouts and the initial non-redundant pipeline circuit layout (including both the initial CLC layouts and the initial SSE layouts) from the IC layout.

With regards to the IC layout of the in silico IC 10, the electronic computational system removes the initial redundant CLC layouts of the TMR pipeline circuit layout for the in silico TMR pipeline circuit 14 from the IC layout. Nevertheless, the TMRSCSSE layouts in the TMR pipeline circuit layout of the in silico TMR pipeline circuit 14 are fixed and remain in the IC layout, as explained above with regards to procedure 1004. However, the initial DMR pipeline circuit layout of the in silico DMR pipeline circuit 16 is removed from the IC layout of the in silico IC 10. This includes both the initial redundant CLC layouts and the initial redundant SSE layouts of the initial DMR pipeline circuit layout. Similarly, the modular redundancy interface layout of the in silico modular redundancy interface 64 is removed from the IC layout. However, the TMRSCSSEs are immotile, thereby allowing for cells to be replaced in the layout without compromising critical node spacing required by the TMRSCSSE.

As such, the electronic computational system places updated redundant CLC layouts in the MMR pipeline circuit layout based on the gate-level netlist with the EDA program after the MMRSCSSE layouts have been rendered immotile (procedure 1008). The placement by the electronic computation system of the updated redundant CLC layouts is automated using the placement algorithms provided by the EDA program. The updated redundant CLC layouts in the MMR pipeline circuit layout can optimize the placement of cells in the updated redundant CLC layouts because the MMRSCSSE layouts have been rendered immotile. Thus, optimization can be provided without compromising the critical node spacing in the topology of the MMRSCSSE layouts. Other updated MMR pipeline circuit layouts of other in silico MMR pipeline circuits without MMRSCSSEs and/or updated non-redundant pipeline circuit layouts of in silico non-redundant pipeline circuits are also placed by the EDA program based on the gate-level netlist (including both updated CLC layouts and updated initial SSE layouts). The IC placement by the electronic computation system of the updated MMR pipeline circuit layouts of other in silico MMR pipeline circuit without MMRSCSSEs and/or updated non-redundant pipeline circuit layouts of in silico non-redundant pipeline circuits is automated using the placement algorithms provided by the EDA program.

With regards to the IC layout of the in silico IC 10, the electronic computational system places updated redundant CLC layouts of the TMR pipeline circuit layout for the in silico TMR pipeline circuit 14 based on the gate-level netlist after the TMRSCSSE layouts have been rendered immotile. Since the TMRSCSSE layouts have been rendered immotile, the updated redundant CLC layouts in the TMR pipeline circuit layout of the in silico TMR pipeline circuit 14 can be optimized without compromising the critical node spacing provided by the topology of the TMRSCSSE layouts. Thus, the A, B, etc., in silico circuits are in isolated rows with only the interfaces between them subject to a simultaneous multiple node collection upset. This reduces the likelihood of such a failure by multiple orders of magnitude. The electronic computational system also places an updated DMR pipeline circuit layout of the in silico DMR pipeline circuit 16 based on the gate-level netlist with the EDA program including updated redundant CLC layouts and updated redundant SSE layouts. Additionally, an updated modular redundancy interface layout of the in silico modular redundancy interface 64 is placed within the IC layout based on the netlist based on the EDA program.

Figure 3:
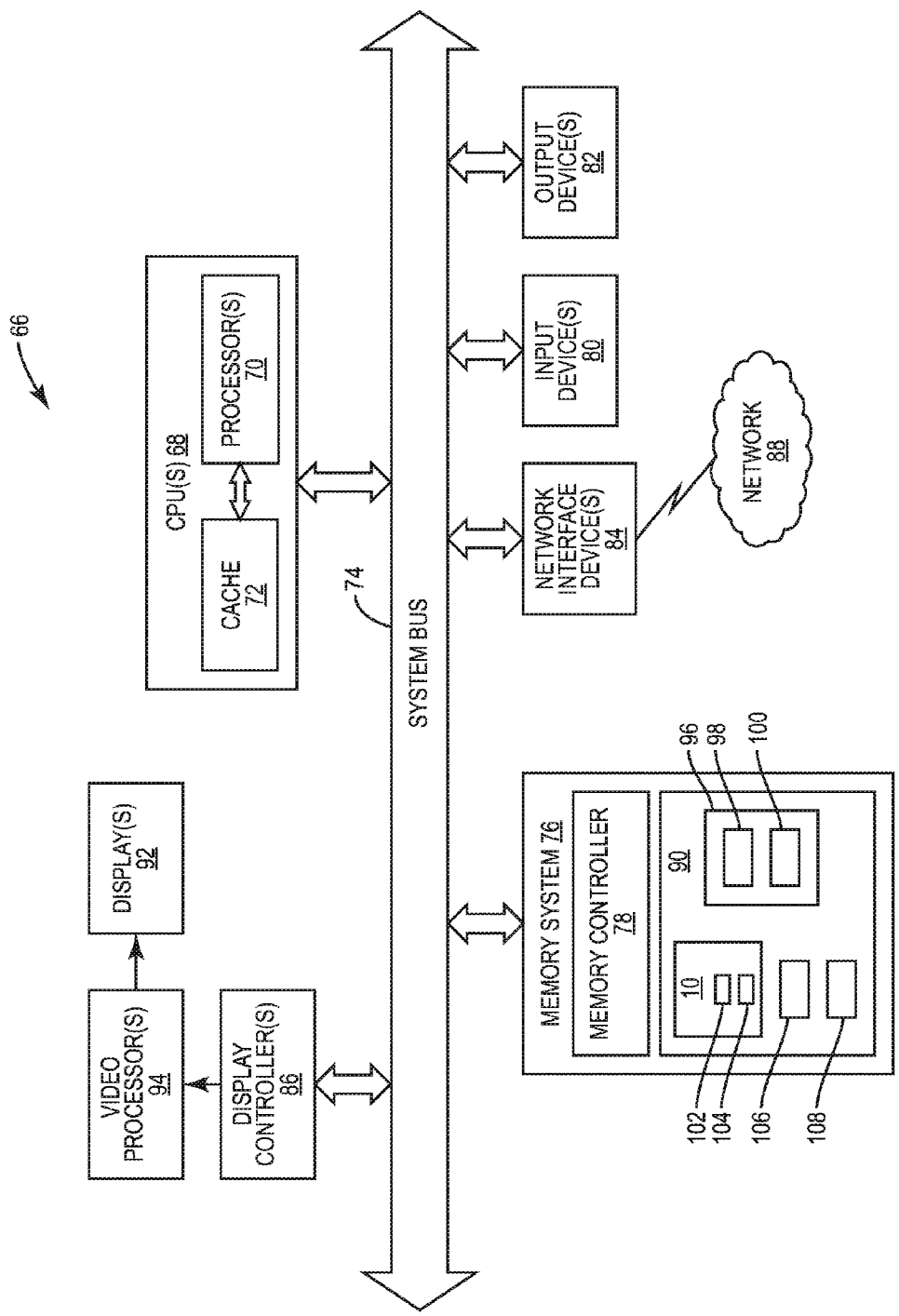
FIG. 3 illustrates one embodiment of an electronic computational system configured to perform the procedures described above with respect to FIG. 2.

With regard to FIGS. 2 and 3, a user can determine whether an IC layout 104 is satisfactory after any one of the procedures 1002-1008. For example, the user may determine from output (i.e. visual output) of an EDA program 100 that a particular configuration simply does not fit the components defined by a gate-level netlist 102 (shown in FIG. 3). Additionally, the user may be unsatisfied with placement congestion and preliminary timing of the IC layout is satisfactory. If the user is not satisfied, the user may enter updated design specifications (procedure 1010). Procedure 1002 can then be repeated so that initial placement is again provided with new design parameters such as a new floorplan. Procedures 1002-1010 can be repeated and/or the procedural flow can be interrupted any number of times until the user is satisfied with the placement congestion and the preliminary timing of the IC layout. If the user is satisfied with the IC layout 104 after updated placement, the electronic computational system routes the IC layout with the EDA program after placing the updated redundant CLC layouts in the MMR pipeline circuit layout (procedure 1012). Thus an electronic computational system 66 (shown in FIG. 3) is configured to wire the IC layout 104 and provide detailed timing optimization based on a clock tree synthesis provided by the EDA program 100.

With regards to the IC layout 104 of the in silico IC 10, the electronic computational system routes the TMR pipeline circuit layout of the in silico TMR pipeline circuit 14, the updated DMR pipeline circuit layout of the in silico DMR pipeline circuit 16, and the updated modular redundancy interface of the in silico modular redundancy interface 64 after the updated CLC layouts of the TMR pipeline circuit layout have been placed in the TMR pipeline circuit layout. Since the TMRSCSSE layouts have been rendered immotile, routing optimization can take place without compromising the critical node spacing provided by the TMRSCSSE layouts and forcing similar large critical node spacing in the CLC layout portions (CLC areas). At this point, the IC layout is finished and may become part of the in silico IC 10 along with the gate-level netlist. The IC layout may then be sent to a IC foundry, which can create masks based on the IC layout. These masks are then used to create a physical IC. The physical IC has the architecture defined by the IC layout. In this manner, a physical version of the in silico IC 10 modeled by the electronic computation system can be created.

FIG. 3 illustrates an example of an electronic computational system 66 configured to implement the procedures described above with respect to FIG. 2. In this example, the electronic computational system 66 includes one or more central processing units (CPUs) 68, each including one or more processors 70. The CPU(s) 68 may have cache memory 72 coupled to the processor(s) 70 for rapid access to temporarily stored data. The CPU(s) 68 is coupled to a system bus 74 and can intercouple master and slave devices included in the electronic computational system 66. As is well known in the art, the CPU(s) 68 communicates with these other devices by exchanging address, control, and data information over the system bus 74. For example, the CPU(s) 68 can communicate bus transaction requests to the memory controller 78 as an example of a slave device. Although not illustrated in FIG. 3, multiple system buses 74 could be provided, wherein each system bus 74 constitutes a different fabric.

Other master and slave devices can be connected to the system bus 74. As illustrated in FIG. 3, these devices can include a memory system 76, one or more input devices 80, one or more output devices 82, one or more network interface devices 84, and one or more display controllers 86, as examples. The input device(s) 80 can include any type of input device, including but not limited to input keys, switches, voice processors, etc. The output device(s) 82 can include any type of output device, including but not limited to audio, video, other visual indicators, etc. The network interface device(s) 84 can be any devices configured to allow exchange of data to and from a network 88. The network 88 can be any type of network, including but not limited to a wired or wireless network, private or public network, a local area network (LAN), a wide local area network (WLAN), and the Internet. The network interface device(s) 84 can be configured to support any type of communication protocol desired. The memory system 76 can include a computer readable medium 90, which may be organized into memory units that store bits.

The CPU(s) 68 may also be configured to access the display controller(s) 86 over the system bus 74 to control information sent to one or more displays 92. The display controller(s) 86 sends information to the display(s) 92 to be processed via one or more video processors 94, which process the information to be processed into a format suitable for the display(s) 92. The display(s) 92 can include any type of display, including but not limited to a cathode ray tube (CRT), a liquid crystal display (LCD), a plasma display, etc.

In this embodiment, the computer readable medium 90 stores the in silico IC 10 and a Computer Automated Design (CAD) program 96. In this embodiment, the CAD program 96 includes a logical synthesis program 98 and an EDA program 100. The CAD program 96, the logical synthesis program 98 and the EDA program 100 are thus computer executable instructions stored in the computer readable medium and executed by the processor(s) 70 of the CPU(s) 68. The logical synthesis program 98 is implemented to generate a gate-level netlist 102 of the in silico IC 10. The gate-level netlist 102 functionally describes the in silico IC 10 as logical elements. The processor(s) 70 of the CPUs 68 are configured to execute the CAD program 96 and provide a functional computer simulation of the in silico IC 10. The processor(s) 70 of the CPUs 68 are configured to execute the EDA program 100 in order to create an IC layout 104 of the in silico IC 10 based on the gate-level netlist 102, as described by the procedures of FIG. 2. The EDA program 100 may be any type of suitable program for creating a physical representation of an in silico IC 10 from a gate-level netlist. In this embodiment, the EDA program 100 is assumed to be Cadence® Encounter®. However, other EDA programs used in other CAD programs such as Synopsys®, Mentor Graphics®, Zuken®, and the like may be used to create the IC layout 104. Libraries 106 and boundary scripts 108 may also be stored by the computer readable medium 90 and used by the EDA program 100 to generate the IC layout 104, as explained in further detail below.

FIGS. 4-7 illustrate the IC layout 104 of the in silico IC 10 described in FIGS. 1, 1A, and 1B by the electronic computational system 66 shown in FIG. 3 for embodiments of the procedures described above with respect to FIG. 2. The IC layout 104 was created using Cadence® Encounter® based on the gate-level netlist 102 of the in silico IC 10. To create the IC layout 104 from the gate-level netlist 102, the electronic computational system 66 begins running the EDA program 100 by having the processors 70 execute the computer executable instructions of the EDA program 100. Initially, the electronic computational system 66 is configured to load the gate-level netlist 102 of the in silico IC 10 into the EDA program 100 (i.e. the gate-level netlist is provided as input to the EDA program 100 being executed by the processors 70), as described above with respect to procedure 1000). Libraries 106 for cell layouts, boundary scripts 108, timing constraints, along with design parameters may also be loaded into the EDA program 100. The electronic computational system 66 is then configured to generate the IC layout 104 of the in silico IC 10 based on the gate-level netlist 102 with the EDA program 100, wherein the IC layout 104 has a TMR pipeline circuit layout of the in silico TMR pipeline circuit 14, and the TMR pipeline circuit layout includes the initial redundant CLC layouts and TMRSCSSE layouts, as described above with respect to procedure 1002 of FIG. 2.

Figure 4:
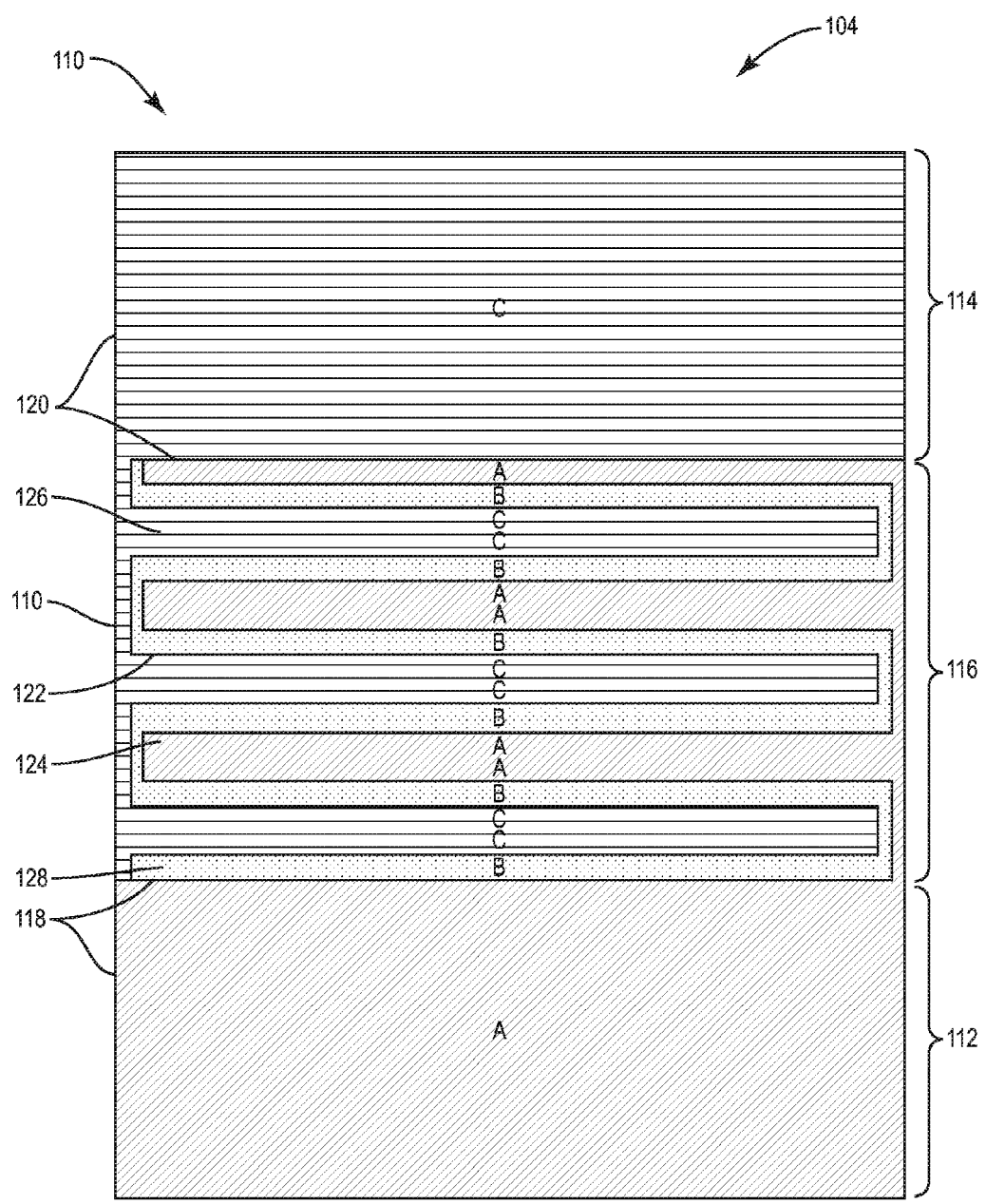
FIG. 4 illustrates one embodiment of an IC layout before placement and having a floorplan that defines interleaved regions for placing the in silico MMR pipeline circuit (i.e., the in silico TMR pipeline circuit) shown in FIG. 1A the within the interleaved regions and polygons for placing the other in silico MMR pipeline circuit (i.e., the in silico DMR pipeline circuit) shown in FIG. 1B.
Figure 5:
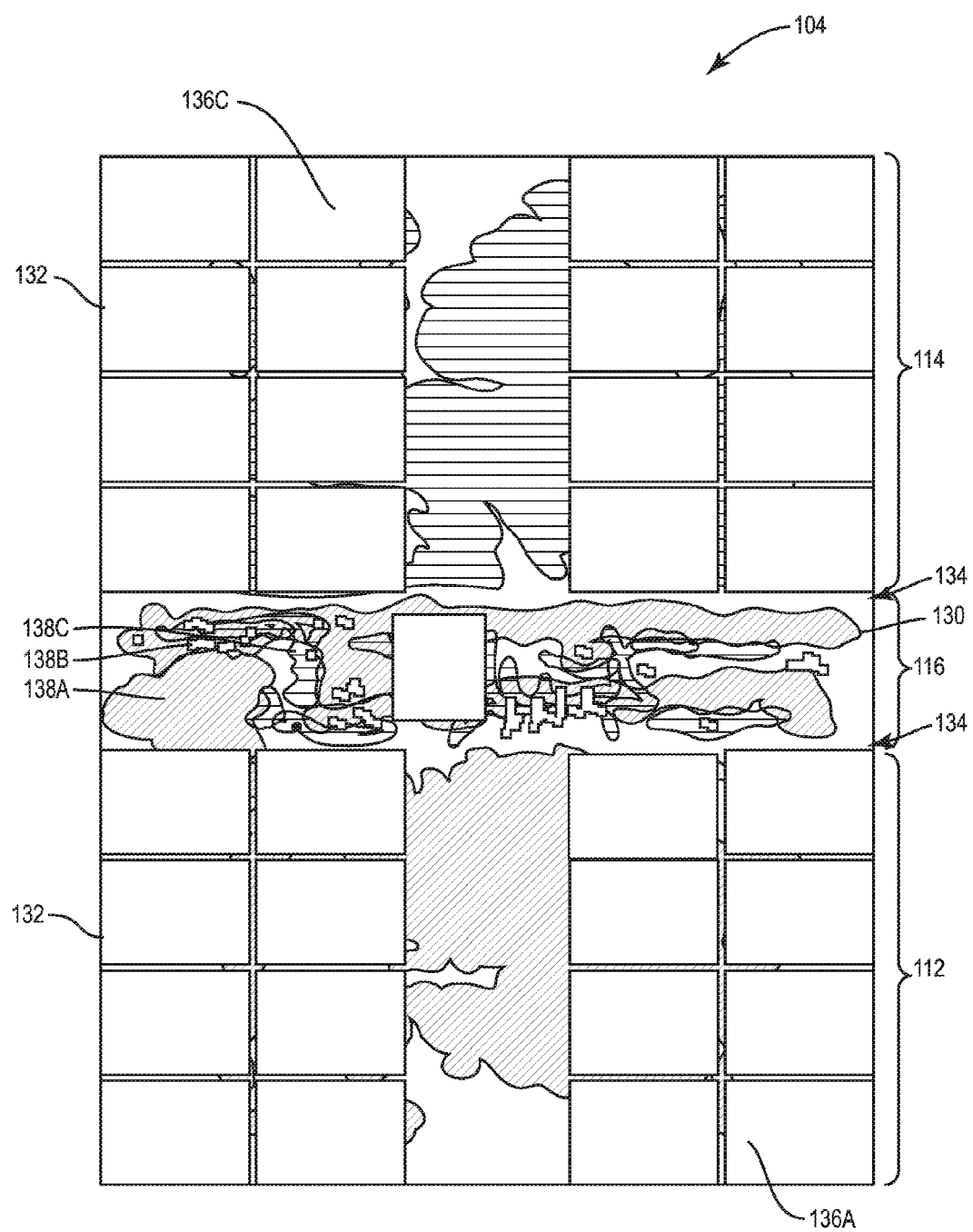
FIG. 5 illustrates the IC layout shown in FIG. 4 after initial placement of the in silico IC shown in FIGS. 1, 1A, 1B.

FIG. 4 and FIG. 5 illustrate how the electronic computational system 66 generates the IC layout 104 based on the gate-level netlist 102 with the EDA program 100. More specifically, a floorplan is initially defined for the IC layout 104 before placement of component layouts based on the gate-level netlist 102. FIG. 4 illustrates the IC layout 104 generated by the electronic computational system 66 in accordance with one embodiment of a floorplan 110 before placement. To define the floorplan 110, the electronic computational system 66 is configured to load one of the boundary scripts 108 (shown in FIG. 3) into the EDA program 100 (shown in FIG. 3) being executed by the processors 70 (shown in FIG. 3) of the CPU(s) 68 (shown in FIG. 3). Each of the boundary scripts 108 (shown in FIG. 3) defines boundary restrictions so as to define regions of the IC layout 104. The gate-level netlist 102 (shown in FIG. 3) is defined such that different portions of the in silico IC 10 are associated with the regions defined by each of the boundary restrictions. In this manner, the EDA program 100 (shown in FIG. 3) is configured to place physical layouts based on the gate-level netlist 102 such that different redundant (or non-redundant) portions of the in silico IC 10 (shown in FIG. 3) are provided in the corresponding region with the EDA program 100 (shown in FIG. 3). In this embodiment, a DMR region 112, a DMR region 114, and a TMR region 116 are defined by the boundary script in the floorplan 110. The floorplan 110 thus sets the DMR region 112 so that placement of a pipeline circuit layout of the in silico pipeline circuits 42 defined by the gate-level netlist 102 is provided in the DMR region 112. The floorplan 110 also sets the DMR region 114 so that placement of a pipeline circuit layout of the in silico pipeline circuit 42C defined by the gate-level netlist 102 is provided in the DMR region 114. The floorplan 110 also defines the TMR region 116 so that redundant pipeline circuit layouts of the in silico pipeline circuits 18A, 18B, and 18C are provided in the TMR region 116.

However, the boundary script 108 further defines boundary restrictions 118, 120, 122. Boundary restriction 118 defines region A. Boundary restriction 120 defines region C. Boundary restriction 122 defines region B. The gate-level netlist 102 is defined such that the in silico mixed mode pipeline circuit PPLA (shown in FIG. 1) is provided within region A, and the in silico mixed mode pipeline circuit PPLC (shown in FIG. 1) is provided in region C. The in silico pipeline circuit 18B (shown in FIG. 1A) of the in silico TMR pipeline circuit 14 (shown in FIGS. 1 and 1A) is assigned to region B. The boundary restrictions 118, 120, 122 are initially provided in the floorplan 110 as soft boundary restrictions, which for Encounter® are referred to as guides. Later, as explained in further detail below, the boundary restrictions 118, 120, 122 are converted to hard boundary restrictions. In this embodiment, region A includes the DMR region 112 and a interleaved region 124 within the TMR region 116. Region C includes the DMR region 114 and an interleaved region 126 within the TMR region 116. Region B includes an interleaved region 128 within TMR region 116. In this regard, the gate-level netlist 102 is configured such that the in silico pipeline circuit 18A of the in silico TMR pipeline circuit 14 and the in silico pipeline circuit 42A of the in silico DMR pipeline circuit 16 are grouped together as a mixed MMR pipeline circuit PPLA. The gate-level netlist 102 is configured such that the in silico pipeline circuit 18C of the in silico TMR pipeline circuit 14 and the in silico pipeline circuit 42C of the in silico DMR pipeline circuit 16 are grouped together as a mixed MMR pipeline circuit PPLC.

The gate-level netlist 102 thus assigns the mixed MMR pipeline circuit PPLA to be placed within the region A. The mixed MMR pipeline circuit PPLA includes the in silico pipeline circuit 42A, which is restricted to the DMR region 112 and the in silico pipeline circuit 18A, which is permitted in the TMR region 116 and is to be placed in the interleaved region 124 defined by region A. The gate-level netlist 102 also assigns the mixed MMR pipeline circuit PPLC to be placed within the region C. The mixed MMR pipeline circuit PPLC includes the in silico pipeline circuit 42C, which is restricted to the DMR region 114, and the in silico pipeline circuit 18C, which is permitted in the TMR region 116 and is to be placed in the interleaved region 126 defined by region C. Finally, region B is only provided within the TMR region 116 as the interleaved region 128.

The interleaved regions 124, 126, and 128 within the TMR region 116 are interleaved with one another. This allows for the boundary restrictions 118 120, and 122 to remain continuous within the TMR region 116. Furthermore, in this manner, the boundary restriction 118 is provided to remain continuous into the DMR region 112 so that the boundary restriction 118 further encloses the DMR region 112, which is a polygon (in this case, a rectangle). The boundary restriction 120 is also provided to remain continuous into the DMR region 114 so that the boundary restriction 120 further encloses the DMR region 114, which is a also a polygon (in this case, a rectangle). This is important because boundary restrictions 118 for the EDA program 100, such as Encounter®, often require boundary restrictions to be continuous.

As shown in FIG. 4, the boundary restrictions 118, 120, 122 in this embodiment define the interleaved regions 124, 126, and 128 to be approximately of equal area within the TMR region 116. The boundary restriction 118 defines the interleaved region 124 of as a fingered region, while the boundary restriction 120 defines the interleaved region 126 also as a fingered region. The boundary restriction 122 then defines the interleaved region 128 as a serpentine region that extends between the interleaved region 124 and the interleaved region 126. In this manner, the boundary restrictions 118, 120, 122 define the interleaved regions 124, 126, and 128 so as to minimize a number of times different interleaved regions 124, 126, and 128 are adjacent to one another. Within the TMR region 116, horizontal strips of the interleaved regions 124, 126 are defined by the boundary restrictions 118, 120 to be twice as thick as horizontal strips of the interleaved region 128 defined by the boundary restriction. However, the horizontal strips of the interleaved region 128 defined by the boundary restriction 122 are twice as numerous as the horizontal strips of the interleaved regions 124, 126 defined by the boundary restrictions 118, 120 within the TMR region 116. Thus, the interleaved region 128 of region B is interweaved between the interleaved region 124 of region A and the interleaved region 126 of region C.

The TMRSCSSEs of the in silico TMR pipeline circuit 14 (shown in FIGS. 1 and 1A) are restricted to being placed in horizontal sections. Each horizontal section includes an adjacent half of a horizontal strip in the interleaved region 124 in the region A, an adjacent horizontal strip of the interleaved region 128 in the region B, and an adjacent half of a horizontal strip in the interleaved region 126 in the region C. A vertical order of the interleaved region 124 of region A, the interleaved region 128 of region B and the interleaved region 126 of region C is inverted (e.g., A, B, C to C, B, A . . . ) in the horizontal sections. In this manner, a maximum number of horizontal sections of the interleaved region 124 in region A border one another and a maximum number of the interleaved region 124 in region C border one another to minimize a number of times different the regions A, B, C are adjacent to one another. In alternative embodiments, the boundary restrictions 118, 120, 122 in this embodiment define the interleaved regions 124, 126, and 128 each as serpentine regions interweaved with one another. The serpentine regions may be identical or may have different thicknesses depending on the topology of the in silico TMR pipeline circuit 14 (shown in FIGS. 1 and 1A) to be placed within the TMR region 116.

The boundary script 108 also provides the boundary restrictions 118, 120, 122 so that the interleaved regions 124, 126, and 128 are sized so that TMRSCSSE layouts can be placed across the regions A, B, C and provide critical node spacing. The boundary script 108 also provides the boundary restrictions 118, 120, 122 so that the interleaved regions 124, 126, and 128 are appropriately aligned with cell rows and wire pitches so that TMRSCSSE layouts can be provided with the appropriate orientation and routed within the IC layout 104. Once the floorplan 110 is created, the electronic computational system 66 shown in FIG. 3 is configured to place a TMR pipeline circuit layout, an initial DMR pipeline circuit, and an initial modular redundancy interface layout based on the gate-level netlist 102 with the EDA program. As explained above with respect to procedure 1002 in FIG. 2, the TMR pipeline circuit layout is provided so as to have initial CLC layouts and TMRSCSSE layouts for each redundant in silico pipeline stage PS1, PS2, PS3 (shown in FIGS. 1 and 1A) in the in silico TMR pipeline circuit 14 (shown in FIGS. 1 and 1A) of the in silico IC 10 (shown in FIGS. 1, 1A, and 1B).

FIG. 5 illustrates one embodiment of the IC layout 104 after initial placement as described above with respect to procedure 1002 of FIG. 2. The electronic computational system 66 shown in FIG. 3 is configured to place a TMR pipeline circuit layout 130 within the TMR region 116, an initial DMR circuit layout 132 within the DMR regions 112, 114, and an initial modular redundancy interface layout 134 at the borders of the TMR region 116, an initial DMR circuit layout 132 with the DMR regions 112, 114. In this embodiment, an initial pipeline circuit layout 136A of the in silico pipeline circuit 42A (shown in FIGS. 1 and 1B) is placed within the DMR region 112. An initial pipeline circuit layout 136C of the in silico pipeline circuit 42C (shown in FIGS. 1 and 1B) is placed within the DMR region 114. The TMR pipeline circuit layout 130 includes redundant pipeline circuit layouts 138A, 138B, and 138C (referred to generically as element 138). The pipeline circuit layout 138A is a physical layout of the in silico pipeline circuit 18A, the pipeline circuit layout 138B is a physical layout of the in silico pipeline circuit 18B, and the pipeline circuit layout 138C is a physical layout of the in silico pipeline circuit 18C. The pipeline circuit layout 138A includes initial CLC layouts for the in silico pipeline circuit 18A, the pipeline circuit layout 138B includes initial CLC layouts for the in silico pipeline circuit 18B, and the pipeline circuit layout 138C includes initial CLC layouts for the in silico pipeline circuit 18C. The pipeline circuit layouts 138A, 138B, 138C are thus redundant. The TMR pipeline circuit layout 130 also includes the TMRSCSSE layouts. At this stage, the TMRSCSSE layouts are initially provided as motile layouts, which are referred to as "Core" type layouts in Encounter®. Furthermore, the boundary restrictions 118, 120, 122 are soft boundary restrictions, thus while the initial CLC layouts of the pipeline circuit layouts 138A, 138B, 138C were largely placed in the corresponding interleaved region 124, 128, 126, respectively, the EDA program was not forced to provide this placement. However, the TMRSCSSE layouts are provided across each of the corresponding interleaved regions 124, 128, 126 to align appropriately with the corresponding interleaved regions 124, 128, 126.

The electronic computational system 66 is configured to render the TMRSCSSE layouts immotile, as described above with respect to procedure 1004 of FIG. 2. In one embodiment, the electronic computational system 66 is configured to change the TMRSCSSE layouts in Encounter® from "Core" type layouts to "Macro" type layouts. This renders the TMRSCSSE layouts immotile. The electronic computational system 66 is also configured to remove the initial CLC layouts of the pipeline circuit layouts 138A, 138B, 138C, the initial pipeline circuit layouts 136A, 136C, and the initial modular redundancy interface layout 134 from the IC layout 104, as described above with respect to procedure 1006 of FIG. 2. The TMRSCSSE layouts, however, remain in place since the TMRSCSSE layouts were rendered immotile.

Figure 6:
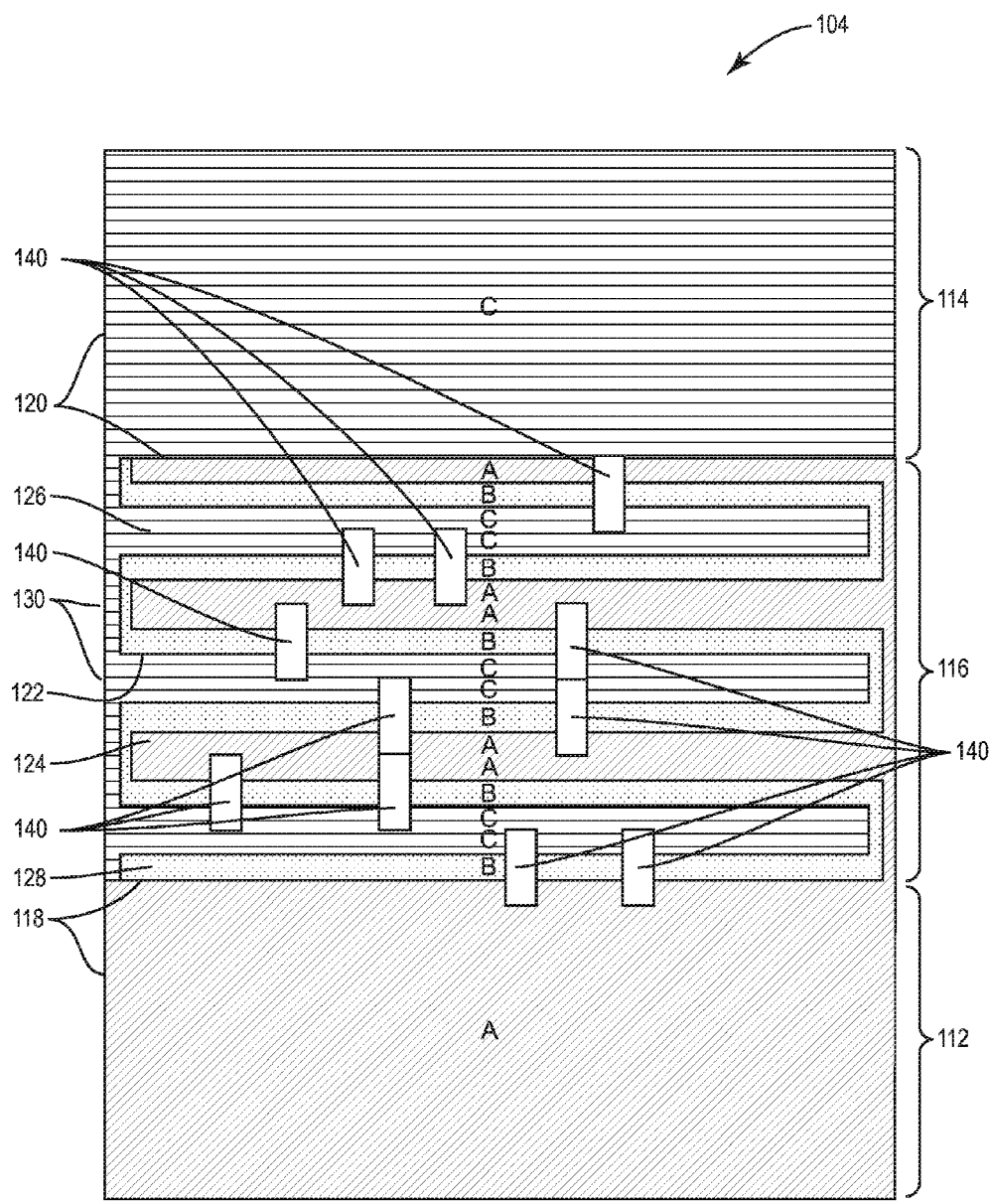
FIG. 6 illustrates the IC layout shown in FIG. 5 after Multi-Mode Redundant Self-Correcting Sequential State Elements (MMRSCSSE) layouts within the interleaved regions have been rendered immotile and all other layouts have been removed.

FIG. 6 illustrates one embodiment of the IC layout 104 after the TMRSCSSE layouts were rendered immotile and the initial CLC layouts of the pipeline circuit layouts 138A, 138B, 138C, the initial pipeline circuit layouts 136A, 136C, and the initial modular redundancy interface layout 134 have been removed from the IC layout 104. FIG. 6 also illustrates TMRSCSSE layouts 140, which are rendered immotile within the IC layout 104. As shown in FIG. 6, each of the TMRSCSSE layouts 140 extends across each of the interleaved regions 124, 126, 128 and thus regions A, B, C within the TMR region 116.

Since the TMRSCSSE layouts 140 are immotile, the electronic computational system 66 is configured to place updated redundant CLC layouts in the TMR pipeline circuit layout 130 of the in silico TMR pipeline circuit 14 (shown in FIGS. 1 and 1A) provided within the TMR region 116 based on the gate-level netlist 102 with the EDA program, as described above with respect to procedure 1008 in FIG. 2. The electronic computational system 66 is configured to place an updated DMR pipeline circuit layout of the in silico DMR pipeline circuit 16 within the DMR regions 112, 114 and an updated modular redundancy interface layout at the boundary of the DMR regions 112, 114 and the TMR regions 116.

To do this, the electronic computational system 66 is configured to convert the boundary restrictions 118, 120, 122 from soft boundary restrictions to hard boundary restrictions. This requires that component layouts assigned to these regions be placed accordingly. The electronic computational system 66 is then configured to place updated redundant CLC layouts in the TMR pipeline circuit layout 130 of the in silico TMR pipeline circuit 14 provided within the TMR region 116, place an updated DMR pipeline circuit layout of the in silico DMR pipeline circuit 16 within the DMR regions 112, 114, and place an updated modular redundancy interface layout at the boundary of the DMR regions 112, 114 and the TMR regions 116.

Figure 7:
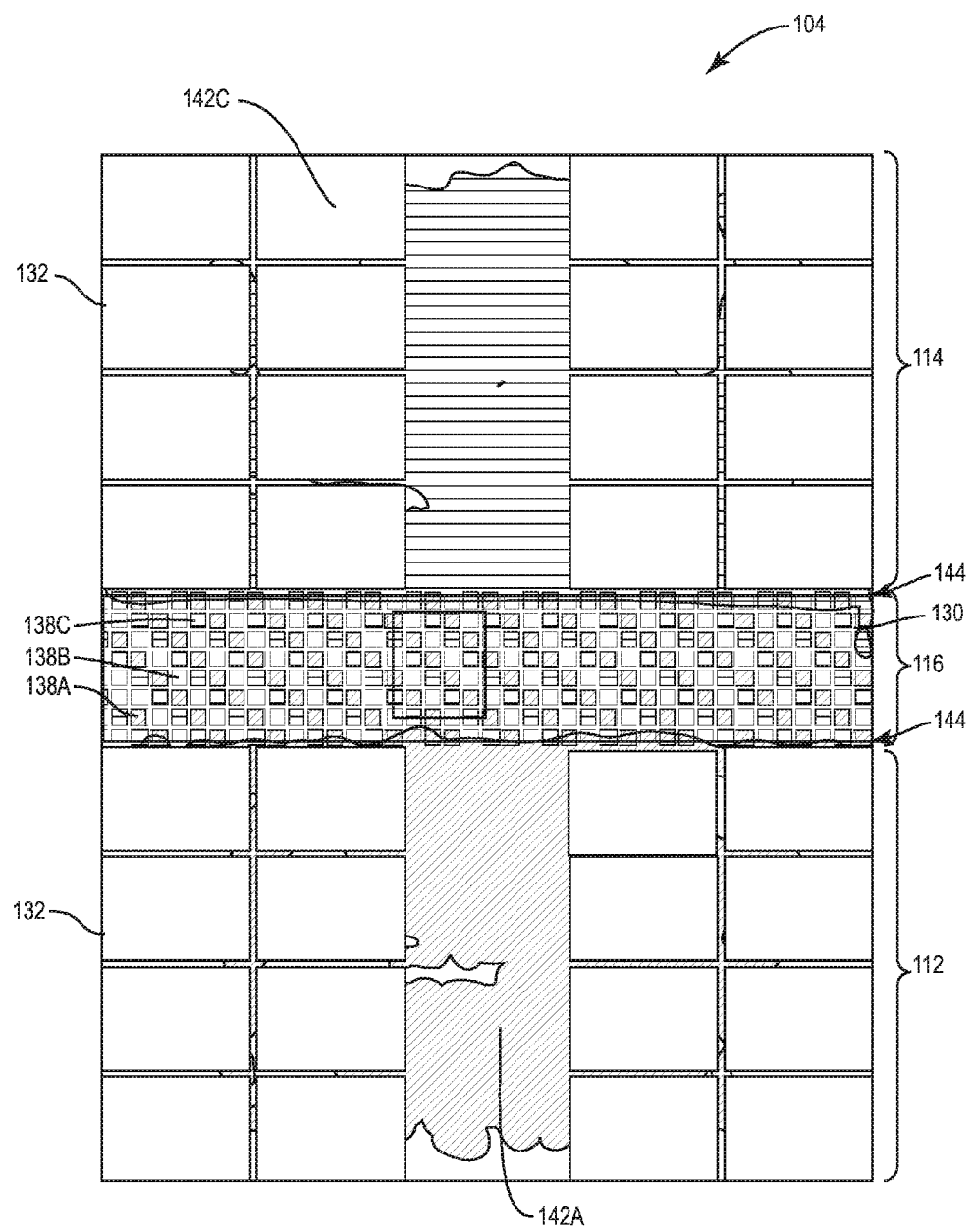
FIG. 7 illustrates the IC layout shown in FIG. 6 after updated layouts have been placed.

FIG. 7 illustrates one embodiment of the IC layout 104 after the TMRSCSSEs have been rendered immotile with updated layouts in accordance with procedure 1008 described above with respect to FIG. 2. In this embodiment, an updated pipeline circuit layout 142A of the in silico pipeline circuit 42A (shown in FIGS. 1 and 1B) is placed within the DMR region 112. An updated pipeline circuit layout 142C of the in silico pipeline circuit 42C (shown in FIGS. 1 and 1B) is placed within the DMR region 114. The TMR pipeline circuit layout 130 includes the redundant pipeline circuit layouts 138A, 138B, 138C. However, the redundant pipeline circuit layout 138A includes updated CLC layouts for the in silico pipeline circuit 18A where the updated CLC layouts have been provided in the interleaved region 124 (shown in FIG. 6) and thus the region A (shown in FIG. 6) within the TMR region 116. The redundant pipeline circuit layout 138B includes updated CLC layouts for the in silico pipeline circuit 18B where the updated CLC layouts have been provided in the interleaved region 128 (shown in FIG. 6) and thus the region B (shown in FIG. 6) within the TMR region 116. The redundant pipeline circuit layout 138C includes updated CLC layouts for the in silico pipeline circuit 18C where the updated CLC layouts have been provided in the interleaved region 126 (shown in FIG. 6) and thus the region C (shown in FIG. 6) within the TMR region 116. The TMR pipeline circuit layout 130 also includes the TMRSCSSE layouts. The updated CLC layouts of each of the redundant pipeline circuit layouts 138A, 138B, 138C have been optimized for placement without compromising critical node spacing, since the TMRSCSSEs have been rendered immotile and since the updated CLC layouts have been forced into the appropriate interleaved regions 124, 126, 128. An updated modular redundancy interface layout 144 at the boundary of the DMR regions 112, 114 and the TMR regions 116.

If the IC layout 104 is unsatisfactory at any point, new design specifications are entered into the EDA program 100, as described above with respect to procedure 1010 of FIG. 2. This may include providing another boundary script 108 along with other parameters, as described in further detail below. Procedures 1002-1008 can then be repeated until the IC layout 104 is satisfactory. Once the IC layout 104 is satisfactory, the electronic computational system 66 is configured to route the IC layout 104, as described above with respect to procedure 1012 of FIG. 2.

Figure 8:
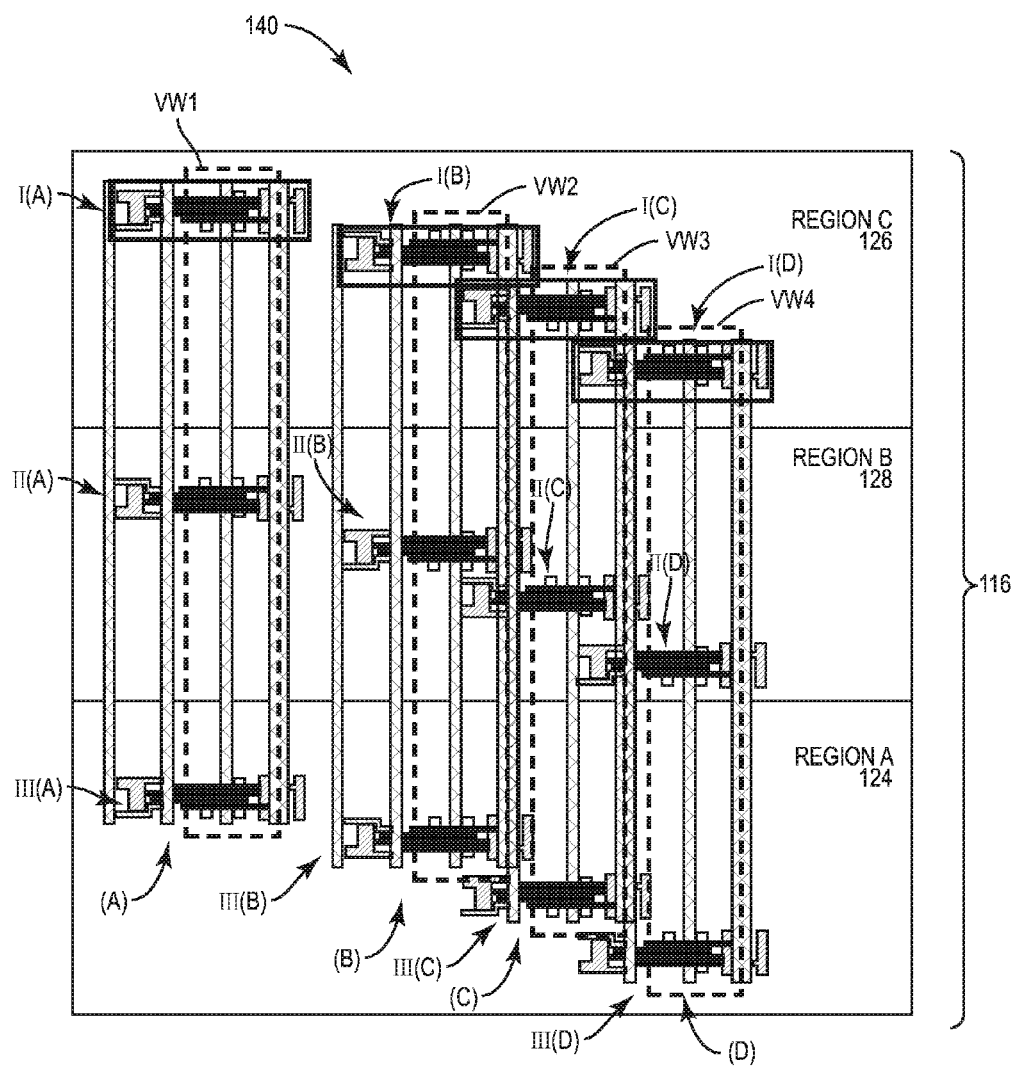
FIG. 8 illustrates an embodiment of a multi-bit MMRSCSSE layout.

FIG. 8 illustrates an exemplary embodiment of one of the TMRSCSSE layouts 140 shown in FIG. 6. Any one, some, or all of the TMRSCSSE layouts 140 shown in FIG. 6 and any of the Figures below may be provided as the TMRSCSSE layout 140 shown in FIG. 8. For example, any of the in silico TMRSCSSEs; such as an in silico TMRSCSSE formed by the in silico SSCs within each in silico TMR pipeline stage PS1, PS2, PS3 of the in silico TMR pipeline circuit 14 shown in FIGS. 1 and 1A; may be provided by the TMRSCSSE layout 140 shown in FIG. 8. The TMRSCSSE layout 140 shown in FIG. 8 is a multi-bit TMRSCSSE layout. As such, each one of the TMRSCSSE layouts 140 shown in FIG. 6 may be provided as the multi-bit TMRSCSSE layout 145.

As shown in FIG. 8, the multi-bit TMRSCSSE layout 145 is a four-bit TMRSCSSE and thus includes four SSE layouts for each redundant in silico pipeline stage. Each of the four SSE layouts provides a single-bit TMRSCSSE with one of the four SSE layouts in the other four SSE layouts. More specifically, a single-bit TMRSCSSE layout (A) has an SSE layout (I)A, an SSE layout (II)A, and an SSE layout (III)A. The SSE layout (I)A, the SSE layout (II)A, and the SSE layout (III)A are routed together to provide majority voting correction. The 3 voting wires for the TMRSCSSE layout (A) connect through a set of wire pitches VW1. TMRSSE layout (B) has an SSE layout (I)B, an SSE layout (II)B, and an SSE layout (III)B. The SSE layout (I)B, the SSE layout (II)B, and the SSE layout (III)B are routed together to provide majority voting correction. The 3 voting wires for the TMRSCSSE layout (B) connect through the set of wire pitches VW2. TMRSCSSE layout (C) has an SSE layout (I)C, an SSE layout (II)C, and an SSE layout (III)C. The SSE layout (I)C, the SSE layout (II)C, and the SSE layout (III)C are routed together to provide majority voting correction. The 3 voting wires for the TMRSCSSE layout (C) connect through the set of wire pitches VW3. TMRSCSSE layout (D) has an SSE layout (I)D, an SSE layout (II)D, and an SSE layout (III)D. The SSE layout (I)D, the SSE layout (II)D, and the SSE layout (III)D are routed together to provide majority voting correction. The 3 voting wires for the TMRSCSSE layout (D) connect through the set of wire pitches VW4.

Note that the SSE layouts SSE layout (I)A, SSE layout (I)B, SSE layout (I)C, and SSE layout (I)D, are each provided within the interleaved region 126 and in region C of the TMR region 116. Thus, the SSE layouts SSE layout (I)A, SSE layout (I)B, SSE layout (I)C, and SSE layout (I)D are provided to connect to CLC layouts of the pipeline circuit layout 138C shown in FIG. 7.

The SSE layouts SSE layout (II)A, SSE layout (II)B, SSE layout (II)C, and SSE layout (II)D, are each provided within the interleaved region 128 and in region B of the TMR region 116. Thus, the SSE layouts SSE layout (II)A, SSE layout (II)B, SSE layout (II)C, and SSE layout (II)D are provided to connect to CLC layouts of the pipeline circuit layout 138C shown in FIG. 7. The SSE layouts SSE layout (III)A, SSE layout (III)B, SSE layout (III)C, and SSE layout (III)D, are each provided within the interleaved region 124 and in region A of the TMR region 116. Thus, the SSE layouts SSE layout (III)A, SSE layout (III)B, SSE layout (III)C, and SSE layout (III)D are provided to connect to CLC layouts of the pipeline circuit layout 138A shown in FIG. 7.

FIG. 9 illustrates the IC layout 104 generated by the electronic computational system 66 in accordance with another embodiment of a floorplan 146 in accordance with another one of the boundary scripts 108. The floorplan 146 is created by the electronic computational system 66 with the EDA program 100 as described above with respect to procedure 1002 in FIG. 2 and FIG. 6. To define the floorplan 146, the electronic computational system 66 is configured to load a particular one of the boundary scripts 108 into the EDA program 100 being executed by the processors 70 of the CPU(s) 68. In this embodiment, the boundary script 108 also defines the DMR region 112, the DMR region 114, and the TMR region 116 just like the boundary script 108 that creates the floorplan 110 shown in FIG. 4. Like the embodiment shown in FIG. 4, the floorplan 146 shown in FIG. 9 also defines the TMR region 116 so that redundant pipeline circuit layouts of the in silico pipeline circuits 18A, 18B, and 18C are provided in the TMR region 116. However, in this embodiment, the floorplan 146 sets the DMR region 112 so that placement of a pipeline circuit layout of the in silico pipeline circuit 42A defined by the gate-level netlist 102 and a pipeline circuit layout of the in silico pipeline circuit 42C defined by the gate-level netlist 102 are provided in the DMR region 112 and in the DMR region 114.

More specifically, the boundary script 108 defined for the floorplan 146 shown in FIG. 9 further defines the boundary restrictions 118, 120, 122 such that the interleaved regions 124, 126, and 128 are provided in the DMR region 112, the DMR region 114, and the TMR region 116. The interleaved regions 124, 126, and 128 within the DMR region 112, the DMR region 114, and the TMR region 116 are interleaved with one another. The boundary restriction 118 defines the region A, which in this embodiment is provided as the interleaved region 124 throughout the entire floorplan 146; and thus within the DMR region 112, the DMR region 114, and the TMR region 116. The boundary restriction 120 defines region C, which in this embodiment is provided as the interleaved region 126 throughout the entire floorplan 146 and thus within the DMR region 112, the DMR region 114, and the TMR region 116. Boundary restriction 122 defines region B.

The boundary restrictions 118, 120, 122 may initially be provided in the floorplan 146 as soft boundary restrictions and then converted to hard boundary restrictions or may be provided as hard boundary restrictions when updated design specifications are provided. The gate-level netlist 102 is defined such that the in silico mixed mode pipeline circuit PPLA (shown in FIG. 1) is provided within region A, and the in silico mixed mode pipeline circuit PPLC (shown in FIG. 1) is provided in region C. The in silico pipeline circuit 18B (shown in FIGS. 1 and 1A) of the in silico TMR pipeline circuit 14 (shown in FIGS. 1 and 1A) is assigned to region B. However, the gate-level netlist 102 also assigns each of the redundant in silico pipeline circuits 18A, 18B, 18C to the TMR region 116.

As shown in FIG. 9, the boundary restrictions 118, 120, 122 in this embodiment define the interleaved regions 124, 126, and 128 to be approximately of equal area within the TMR region 116. The boundary restriction 118 defines the interleaved region 124 of as a fingered region, while the boundary restriction 120 defines the interleaved region 126 also as a fingered region. The boundary restriction 122 then defines the interleaved region 128 as a serpentine region that extends between the interleaved region 124 and the interleaved region 126. In this manner, the boundary restrictions 118, 120, 122 define the interleaved regions 124, 126, and 128 so as to minimize a number of times different interleaved regions 124, 126, and 128 are adjacent to one another. Throughout the entire floorplan 146, horizontal strips of the interleaved regions 124, 126 are defined by the boundary restrictions 118, 120 to be twice as thick as horizontal strips of the interleaved region 128 defined by the boundary restriction. However, the horizontal strips of the interleaved region 128 defined by the boundary restriction 122 are twice as numerous as the horizontal strips of the interleaved regions 124, 126 defined by the boundary restrictions 118, 120. Thus, the interleaved region 128 of region B is interweaved between the interleaved region 124 of region A and the interleaved region 126 of region C.

The TMRSCSSEs of the in silico TMR pipeline circuit 14 (shown in FIGS. 1 and 1A) are restricted to being placed in horizontal sections. Each horizontal section includes an adjacent half of a horizontal strip in the interleaved region 124 in the region A, an adjacent horizontal strip of the interleaved region 128 in the region B, and an adjacent half of a horizontal strip in the interleaved region 126 in the region C. A vertical order of the interleaved region 124 of region A, the interleaved region 128 of region B and the interleaved region 126 of region C is inverted (e.g., A, B, C to C, B, A . . . ) in the horizontal sections. In this manner, a maximum number of horizontal sections of the interleaved region 124 in region A borders one another, and a maximum number of the interleaved region 124 in region C borders one another to minimize a number of times different the regions A, B, C are adjacent to one another. In alternative embodiments, the boundary restrictions 118, 120, 122 in this embodiment define the interleaved regions 124, 126, and 128 each as serpentine regions interweaved with one another. The serpentine regions may be identical or may be have different thicknesses depending on the topology of the in silico TMR pipeline circuit 14 (shown in FIGS. 1 and 1A) to be placed within the TMR region 116.

The boundary script 108 that defines the floorplan 146 also provides the boundary restrictions 118, 120, 122 so that the interleaved regions 124, 126, and 128 are sized so that TMRSCSSE layouts can be placed across the regions A, B, C and provide critical node spacing. The boundary script 108 also provides the boundary restrictions 118, 120, 122 so that the interleaved regions 124, 126, and 128 are appropriately aligned with cell rows and wire pitches so that TMRSCSSE layouts can be provided with the appropriate orientation and routed within the IC layout 104. The electronic computational system 66 shown in FIG. 3 is configured to place a TMR pipeline circuit layout, an initial DMR pipeline circuit, and an initial modular redundancy interface layout based on the gate-level netlist 102 with the EDA program.

FIG. 10 illustrates another embodiment of the IC layout 104 after the TMRSCSSE layouts 41 (not all labeled for the sake of clarity) have been rendered immotile in accordance with procedure 1004 described in FIG. 2 and with updated layouts in accordance with procedure 1008 described above with respect to FIG. 2. The TMR pipeline circuit layout 130 includes the redundant pipeline circuit layouts 148A, 148B, 148C of the in silico pipeline circuits 18A, 18B, 18C (shown in FIGS. 1 and 1A) for the in silico TMR pipeline circuit 14 (shown in FIGS. 1 and 1A). The pipeline circuit layout 148A includes updated CLC layouts for the in silico pipeline circuit 18A where the updated CLC layouts have been provided in the interleaved region 124 (shown in FIG. 9) and thus the region A (shown in FIG. 9) within the TMR region 116. The pipeline circuit layout 148B includes updated CLC layouts for the in silico pipeline circuit 18B where the updated CLC layouts have been provided in the interleaved region 128 (shown in FIG. 9) and thus the region B (shown in FIG. 9) within the TMR region 116. The pipeline circuit layout 148C includes updated CLC layouts for the in silico pipeline circuit 18C where the updated CLC layouts have been provided in the interleaved region 126 (shown in FIG. 9) and thus the region C (shown in FIG. 9) within the TMR region 116.

In this embodiment, updated redundant pipeline circuit layouts 150A, 150C of the in silico pipeline circuit 42A, 42C (shown in FIGS. 1 and 1B) of the in silico DMR pipeline circuit 16 (shown in FIGS. 1 and 1B) are provided in the DMR regions 112, 114. The updated pipeline circuit layout 150A of the in silico pipeline circuit 42A (shown in FIGS. 1 and 1B) is placed within the region A provided in DMR region 112 and the DMR region 114. More specifically, the updated pipeline circuit layout 150A of the in silico pipeline circuit 42A (shown in FIGS. 1 and 1B) is placed within the interleaved region 124 provided in DMR region 112 and the DMR region 114. The updated pipeline circuit layout 150C of the in silico pipeline circuit 42C (shown in FIGS. 1 and 1B) is placed within the region C provided in DMR region 112 and the DMR region 114. More specifically, the updated pipeline circuit layout 150C of the in silico pipeline circuit 42C (shown in FIGS. 1 and 1B) is placed within the interleaved region 126 provided in DMR region 112 and the DMR region 114. An updated modular redundancy interface layout 152 is at the boundary of the DMR regions 112, 114 and the TMR regions 116. Note that in this embodiment, the interleaved region 128 (shown in FIG. 9) within the DMR regions 112, 114 does not include a pipeline circuit layout because no DMR pipeline is assigned to it. Therefore, some layout area is not fully utilized in this case.

If the IC layout 104 is unsatisfactory at any point, new design specifications are entered into the EDA program 100, as described above with respect to procedure 1010 of FIG. 2. This may include providing another boundary script 108 along with other parameters, as described in further detail below. Procedures 1002-1008 can then be repeated until the IC layout 104 is satisfactory. Once the IC layout 104 is satisfactory, the electronic computational system 66 is configured to route the IC layout 104, as described above with respect to procedure 1012 of FIG. 2.

FIG. 11 illustrates the IC layout 104 generated by the electronic computational system 66 in accordance with still another embodiment of a floorplan 154 in accordance with still another one of the boundary scripts 108. The floorplan 154 may be created by the electronic computational system 66 with the EDA program 100 during procedure 1002 as described above with respect to procedure 1002 in FIG. 2 and FIG. 6. To define the floorplan 154, the electronic computational system 66 is configured to load the particular boundary scripts 108 into the EDA program 100 being executed by the processors 70 of the CPU(s) 68. In this embodiment, the boundary script 108 also defines the DMR region 112, the DMR region 114, and the TMR region 116 just like the boundary script 108 that creates the floorplan 110 shown in FIG. 4. Like the embodiment shown in FIG. 4, the floorplan 154 shown in FIG. 11 also defines the TMR region 116 so that redundant pipeline circuit layouts of the in silico pipeline circuits 18A, 18B, and 18C are provided in the TMR region 116. However, in this embodiment, the floorplan 154 sets the DMR region 112 so that placement of a pipeline circuit layout of the in silico pipeline circuit 42A defined by the gate-level netlist 102 and placement of a pipeline circuit layout of the in silico pipeline circuit 42C defined by the gate-level netlist 102 are provided in the DMR region 112 and in the DMR region 114.

More specifically, the boundary script 108 defined for the floorplan 154 shown in FIG. 11 further defines the boundary restrictions 118, 120, 122 such that the interleaved region 124 and interleaved region 126 are provided in the DMR region 112, the DMR region 114, and the TMR region 116. The interleaved regions 124, 126, and 128 within the DMR region 112, the DMR region 114, and the TMR region 116 are interleaved with one another. However, in this embodiment, the interleaved region 128 defined by the boundary restriction 122 is not provided in the DMR regions 112, 114 but rather only in the TMR region 116. The boundary restriction 118 defines the region A, which in this embodiment is provided as the interleaved region 124 throughout the entire floorplan 154 and thus within the DMR region 112, the DMR region 114, and the TMR region 116. The interleaved region 124 is thinner within the DMR region 112 and the DMR region 114 than within the TMR region 116 and borders the interleaved region 126 within the DMR region 112 and the DMR region 114. The boundary restriction 120 defines region C, which in this embodiment is provided as the interleaved region 126 throughout the entire floorplan 154 and thus within the DMR region 112, the DMR region 114, and the TMR region 116. The interleaved region 126 is thinner within the DMR region 112 and the DMR region 114 than within the TMR region 116 and borders the interleaved region 124 within the DMR region 112 and the DMR region 114. Boundary restriction 122 defines region B. However, the boundary restriction 122 defines the region B, and the interleaved region 128 only within the TMR region 116.

The boundary restrictions 118, 120, 122 may initially be provided in the floorplan 154 as soft boundary restrictions and then converted to hard boundary restrictions or may be provided as hard boundary restrictions when updated design specifications are provided. The gate-level netlist 102 is defined such that the in silico mixed mode pipeline circuit PPLA (shown in FIG. 1) is provided within region A and the in silico mixed mode pipeline circuit PPLC (shown in FIG. 1) is provided in region C. The in silico pipeline circuit 18B (shown in FIGS. 1 and 1A) of the in silico TMR pipeline circuit 14 (shown in FIGS. 1 and 1A) is assigned to region B. However, the gate-level netlist 102 also assigns each of the redundant in silico pipeline circuits 18A, 18B, 18C to the TMR region 116.

As shown in FIG. 11, the boundary restrictions 118, 120, 122 in this embodiment define the interleaved regions 124, 126, and 128 to be approximately of equal area within the TMR region 116. Additionally, the boundary restrictions 118, 120, 122 define the interleaved regions 124, 126, and 128 so as to minimize a number of times different regions are adjacent to one another. Thus, the interleaved region 128 of region B is interweaved between the interleaved region 124 of region A and the interleaved region 126 of region C within the TMR region 116. A vertical order of the horizontal sections of the interleaved region 124 of region A, the interleaved region 128 of region B and the interleaved region 126 of region C is inverted so that a maximum number of horizontal sections of the interleaved region 124 in region A border one another, and a maximum number of the interleaved region 124 in region C border one another to minimize a number of times different regions are adjacent to one another.

The boundary script 108 also provides the boundary restrictions 118, 120, 122 so that the interleaved regions 124, 126, and 128 are sized so that TMRSCSSE layouts can be placed across the regions A, B, C and provide critical node spacing. The boundary script 108 also provides the boundary restrictions 118, 120, 122 so that the interleaved regions 124, 126, and 128 are appropriately aligned with cell rows and wire pitches so that TMRSCSSE layouts can be provided with the appropriate orientation and routed within the IC layout 104. If the floorplan 154 is created with regard to procedure 1002 of FIG. 2, the floorplan 154 is initially provided with the boundary restrictions 118, 120, 122 as soft boundary restrictions, which are later converted to hard boundary restrictions during procedure 1008 of FIG. 2. The electronic computational system 66 shown in FIG. 3 is configured to place a TMR pipeline circuit layout, an initial DMR pipeline circuit, and an initial modular redundancy interface layout based on the gate-level netlist 102 with the EDA program 100.

FIG. 12 illustrates another embodiment of the IC layout 104 after the TMRSCSSE layouts 140 (not all labeled for the sake of clarity) have been rendered immotile (procedure 1004) and with updated layouts in accordance with procedure 1008 described above with respect to FIG. 2. The TMR pipeline circuit layout 130 includes the redundant pipeline circuit layouts 156A, 156B, 156C of the in silico pipeline circuits 18A, 18B, 18C (shown in FIGS. 1 and 1A) for the in silico TMR pipeline circuit 14 (shown in FIGS. 1 and 1A). The pipeline circuit layout 156A includes updated CLC layouts for the in silico pipeline circuit 18A where the updated CLC layouts have been provided in the interleaved region 124 (shown in FIG. 11) and thus the region A (shown in FIG. 11) within the TMR region 116. The pipeline circuit layout 156B includes updated CLC layouts for the in silico pipeline circuit 18B where the updated CLC layouts have been provided in the interleaved region 128 (shown in FIG. 11) and thus the region B (shown in FIG. 11) within the TMR region 116. The pipeline circuit layout 156C includes updated CLC layouts for the in silico pipeline circuit 18C where the updated CLC layouts have been provided in the interleaved region 126 (shown in FIG. 11) and thus the region C (shown in FIG. 11) within the TMR region 116.

In this embodiment, updated redundant pipeline circuit layouts 150A, 150C of the in silico pipeline circuit 42A, 42C (shown in FIGS. 1 and 1B) of the in silico DMR pipeline circuit 16 (shown in FIGS. 1 and 1B) are provided in the DMR regions 112, 114. The updated redundant pipeline circuit layout 150A of the in silico pipeline circuit 42A (shown in FIGS. 1 and 1B) is placed within the region A provided in DMR region 112 and the DMR region 114. More specifically, the updated redundant pipeline circuit layout 150A of the in silico pipeline circuit 42A (shown in FIGS. 1 and 1B) is placed within the interleaved region 124 provided in DMR region 112 and the DMR region 114. The updated redundant pipeline circuit layout 150C of the in silico pipeline circuit 42C (shown in FIGS. 1 and 1B) is placed within the region C provided in DMR region 112 and the DMR region 114. More specifically, the updated redundant pipeline circuit layout 150C of the in silico pipeline circuit 42C (shown in FIGS. 1 and 1B) is placed within the interleaved region 126 provided in DMR region 112 and the DMR region 114. An updated modular redundancy interface layout 160 is at the boundary of the DMR regions 112, 114 and the TMR regions 116. Note that in this embodiment, the interleaved region 124, 126 (shown in FIG. 9) are adjacent within the DMR regions 112, 114 and the interleaved regions 128, along with region B are not included. Therefore, the layout area is more fully utilized in this case.

If the IC layout 104 is unsatisfactory at any point, new design specifications are entered into the EDA program 100, as described above with respect to procedure 1010 of FIG. 2. This may include providing another boundary script 108 along with other parameters, as described in further detail below. Procedures 1002-1008 can then be repeated until the IC layout 104 is satisfactory. Once the IC layout 104 is satisfactory, the electronic computational system 66 is configured to route the IC layout 104, as described above with respect to procedure 1012 of FIG. 2.

FIG. 13 illustrates the IC layout 104 generated by the electronic computational system 66 in accordance with yet still another embodiment of a floorplan 162 in accordance with still another one of the boundary scripts 108. The floorplan 162 may be created by the electronic computational system 66 with the EDA program 100 as described above with respect to procedure 1002 in FIG. 2. To define the floorplan 162, the electronic computational system 66 is configured to load the particular boundary scripts 108 into the EDA program 100 being executed by the processors 70 of the CPU(s) 68. In this embodiment, the boundary script 108 also defines the DMR region 112, the DMR region 114, and the TMR region 116 just like the boundary script 108 that creates the floorplan 110 shown in FIG. 4. Like the embodiment shown in FIG. 4, the floorplan 162 shown in FIG. 13 also defines the TMR region 116 so that redundant pipeline circuit layouts of the in silico pipeline circuits 18A, 18B, and 18C are provided in the TMR region 116. However, in this embodiment, the floorplan 162 sets the DMR region 112 so that placement of a pipeline circuit layout of the in silico pipeline circuit 42A defined by the gate-level netlist 102 and a pipeline circuit layout of the in silico pipeline circuit 42C defined by the gate-level netlist 102 are provided in the DMR region 112 and in the DMR region 114.

More specifically, the boundary script 108 defined for the floorplan 162 shown in FIG. 13 further defines the boundary restrictions 118, 120, 122 such that the interleaved regions 124, 126, 128 are only provided in the TMR region 116. The interleaved regions 124, 126, and 128 within the TMR region 116 are interleaved with one another. However, in this embodiment, the interleaved region 128 defined by the boundary restriction 122 is not provided in the DMR regions 112, 114 but rather only in the TMR region 116. The boundary restriction 118 defines the region A, which in this embodiment is provided as the interleaved region 124 within TMR region 116, a polygon (in this case a rectangle) within the DMR region 112, and another polygon (in this case a rectangle within the DMR region 114). The boundary restriction 120 defines the region C, which in this embodiment is provided as the interleaved region 126 within TMR region, a polygon (in this case a rectangle) within the DMR region 112, and another polygon (in this case a rectangle within the DMR region 114). Boundary restriction 122 defines region B. However, the boundary restriction 122 defines region B and the interleaved region 128 only within the TMR region 116. The polygon of region A and the polygon of region C within the DMR region 112 border one another. Similarly, the polygon of region A and the polygon of region C border one another. The polygons of region A in the DMR region 112 and the DMR region 114 are vertically aligned. Similarly, the polygons of region C in the DMR region 112 and the DMR region 114 are vertically aligned.

The boundary restrictions 118, 120, 122 may initially be provided in the floorplan 162 as soft boundary restrictions and then converted to hard boundary restrictions or may be provided as hard boundary restrictions when updated design specifications are provided. The gate-level netlist 102 is defined such that the in silico mixed mode pipeline circuit PPLA (shown in FIG. 1) is provided within region A, and the in silico mixed mode pipeline circuit PPLC (shown in FIG. 1) is provided in region C. The in silico pipeline circuit 18B (shown in FIGS. 1 and 1A) of the in silico TMR pipeline circuit 14 (shown in FIGS. 1 and 1A) is assigned to region B. However, the gate-level netlist 102 also assigns each of the redundant in silico pipeline circuit 18A, 18B, 18C to the TMR region 116.

As shown in FIG. 13, the boundary restrictions 118, 120, 122 in this embodiment define the interleaved regions 124, 126, and 128 to be approximately of equal area within the TMR region 116. Additionally, the boundary restrictions 118, 120, 122 define the interleaved regions 124, 126, and 128 so as to minimize a number of times different regions are adjacent to one another. Thus, the interleaved region 128 of region B is interweaved between the interleaved region 124 of region A and the interleaved region 126 of region C within the TMR region 116. A vertical order of the horizontal sections of the interleaved region 124 of region A, the interleaved region 128 of region B and the interleaved region 126 of region C is inverted so that a maximum number of horizontal sections of the interleaved region 124 in region A border one another and a maximum number of the interleaved region 124 in region C border one another to minimize a number of times different regions are adjacent to one another.

The boundary script 108 also provides the boundary restrictions 118, 120, 122 so that the interleaved regions 124, 126, and 128 are sized so that TMRSCSSE layouts can be placed across the regions A, B, C and provide critical node spacing. The boundary script 108 also provides the boundary restrictions 118, 120, 122 so that the interleaved regions 124, 126, and 128 are appropriately aligned with cell rows and wire pitches so that TMRSCSSE layouts can be provided with the appropriate orientation and routed within the IC layout 104. If the floorplan 162 is created with regard to procedure 1002 of FIG. 2, the floorplan 162 is initially provided with the boundary restrictions 118, 120, 122 as soft boundary restrictions, which are later converted to hard boundary restrictions during procedure 1008 of FIG. 2. The electronic computational system 66 shown in FIG. 3 is configured to place a TMR pipeline circuit layout, an initial DMR pipeline circuit, and an initial modular redundancy interface layout based on the gate-level netlist 102 with the EDA program.

FIG. 14 illustrates another embodiment of the IC layout 104 after the TMRSCSSE layouts 140 (not all labeled for the sake of clarity) have been rendered immotile and with updated layouts in accordance with procedure 1008 described above with respect to FIG. 2. The TMR pipeline circuit layout 130 includes the redundant pipeline circuit layouts 164A, 164B, 164C of the in silico pipeline circuits 18A, 18B, 18C (shown in FIGS. 1 and 1A) for the in silico TMR pipeline circuit 14 (shown in FIGS. 1 and 1A). The pipeline circuit layout 164A includes updated CLC layouts for the in silico pipeline circuit 18A where the updated CLC layouts have been provided in the interleaved region 124 (shown in FIG. 13) and thus the region A (shown in FIG. 13) within the TMR region 116. The pipeline circuit layout 164B includes updated CLC layouts for the in silico pipeline circuit 18B where the updated CLC layouts have been provided in the interleaved region 128 (shown in FIG. 13) and thus the region B (shown in FIG. 13) within the TMR region 116. The pipeline circuit layout 164C includes updated CLC layouts for the in silico pipeline circuit 18C where the updated CLC layouts have been provided in the interleaved region 126 (shown in FIG. 13) and thus the region C (shown in FIG. 13) within the TMR region 116.

In this embodiment, updated redundant pipeline circuit layouts 166A, 166C of the in silico pipeline circuit 42A, 42C (shown in FIGS. 1 and 1B) of the in silico DMR pipeline circuit 16 (shown in FIGS. 1 and 1B) are provided in the DMR regions 112, 114. The updated pipeline circuit layout 166A of the in silico pipeline circuit 42A (shown in FIGS. 1 and 1B) is placed within the region A provided in the DMR region 112 and the DMR region 114. More specifically, the updated pipeline circuit layout 166A of the in silico pipeline circuit 42A (shown in FIGS. 1 and 1B) is placed within the polygons of region A provided in the DMR region 112 and the DMR region 114. The updated pipeline circuit layout 166C of the in silico pipeline circuit 42C (shown in FIGS. 1 and 1B) is placed within the region C provided in the DMR region 112 and the DMR region 114. More specifically, the updated pipeline circuit layout 166C of the in silico pipeline circuit 42C (shown in FIGS. 1 and 1B) is placed within the polygons of region C provided in the DMR region 112 and the DMR region 114. An updated modular redundancy interface layout 168 is provided at the boundary of the DMR regions 112, 114 and the TMR region 116.

If the IC layout 104 is unsatisfactory at any point, new design specifications are entered into the EDA program 100, as described above with respect to procedure 1010 of FIG. 2. This may include providing another boundary script 108 along with other parameters, as described in further detail below. Procedures 1002-1008 can then be repeated until the IC layout 104 is satisfactory. Once the IC layout is satisfactory, the electronic computational system 66 is configured to route the IC layout 104, as described above with respect to procedure 1012 of FIG. 2.

Those skilled in the art will recognize improvements and modifications to the preferred embodiments of the present disclosure. All such improvements and modifications are considered within the scope of the concepts disclosed herein and the claims that follow.

What is claimed is:

1. A computer program product for producing a physical representation of an in silico integrated circuit (IC) having an in silico multi-mode redundant (MMR) pipeline circuit, the computer program product stored on a non-transitory computer-readable storage medium and including instructions to cause a processor device to:
   load a gate-level netlist of the in silico IC into an electronic design automation (EDA) program;
   generate an IC layout of the in silico IC based on the gate-level netlist with the EDA program, wherein the IC layout has an MMR pipeline circuit layout of the in silico MMR pipeline circuit, and the MMR pipeline circuit layout includes initial redundant combinational logic circuit (CLC) layouts and multi-mode redundant self-correcting sequential state element (MMRSCSSE) layouts;

render the MMRSCSSE layouts immotile within the IC layout;

remove the initial redundant CLC layouts of the MMR pipeline circuit layout from the IC layout; and place updated redundant CLC layouts in the MMR pipeline circuit layout based on the gate-level netlist with the EDA program after the MMRSCSSE layouts have been rendered immotile.

2. The computer program product of claim 1 wherein the instructions cause the processor to:

create a floorplan of the IC layout using the EDA program wherein the floorplan has boundary restrictions that define a plurality of interleaved regions within the IC layout and wherein the plurality of interleaved regions are interweaved with one another when generating the IC layout of the in silico IC based on the gate-level netlist with the EDA program; and place each of the MMRSCSSE layouts of the in silico MMR pipeline circuit within the plurality of interleaved regions.

3. The computer program product of claim 2 wherein the instructions cause the processor to place the updated redundant CLC layouts in the MMR pipeline circuit layout based on the gate-level netlist with the EDA program after the MMRSCSSE layouts have been rendered immotile such that each of the updated redundant CLC layouts in the MMR pipeline circuit layout is placed within a different one of the plurality of interleaved regions.

4. The computer program product of claim 3 wherein the instructions cause the processor to create the floorplan of the IC layout using the EDA program such that the floorplan has soft-boundary restrictions.

5. The computer program product of claim 4 wherein the instructions cause the processor to generate the IC layout of the in silico IC based on the gate-level netlist with the EDA program such that the initial redundant CLC layouts are placed within the plurality of interleaved regions using the soft boundary restrictions.

6. The computer program product of claim 5 wherein the instructions cause the processor to convert the boundary restrictions from the soft boundary restrictions to hard boundary restrictions such that each of the updated redundant CLC layouts in the MMR pipeline circuit layout is restricted to being placed within the different one of the plurality of interleaved regions.

7. The computer program product of claim 1 wherein the in silico MMR pipeline circuit is a triple mode redundant (TMR) pipeline circuit such that the MMR pipeline circuit layout is a TMR circuit layout and the MMRSCSSE layouts are triple mode redundant self-correcting sequential state element (TMRSCSSE) layouts.

8. The computer program product of claim 7 wherein at least one of the TMRSCSSE layouts is a multi-bit TMRSCSSE layout.

9. The computer program product of claim 1 wherein the in silico IC further includes a second in silico MMR pipeline circuit of a different modular redundancy than the in silico MMR pipeline circuit.

10. The computer program product of claim 9 wherein the instructions cause the processor to generate the IC layout of the in silico IC based on the gate-level netlist with the EDA program such that the IC layout further comprises an initial MMR pipeline circuit layout of the second in silico MMR pipeline circuit.

11. The computer program product of claim 10 wherein the instructions cause the processor to remove the initial MMR pipeline circuit layout of the second in silico MMR pipeline circuit.

12. The computer program product of claim 11 wherein the instructions cause the processor to place an updated MMR pipeline circuit layout of the second in silico MMR pipeline circuit in the IC layout based on the gate-level netlist with the EDA program after the MMRSCSSE layouts have been rendered immotile.

13. The computer program product of claim 12 wherein:

the in silico MMR pipeline circuit is an in silico triple mode redundant (TMR) pipeline circuit such that the MMR pipeline circuit layout is a TMR circuit layout and the MMRSCSSE layouts are triple mode redundant self-correcting sequential state element (TMRSCSSE) layouts; and the second in silico MMR pipeline circuit is a dual mode redundant (DMR) pipeline circuit such that the initial MMR pipeline circuit layout is an initial DMR pipeline circuit layout and the updated MMR circuit layout is an updated DMR pipeline circuit layout.

14. The computer program product of claim 1 wherein the in silico IC further comprises an in silico dual mode redundant (DMR) pipeline circuit layout and wherein the in silico MMR pipeline circuit is an in silico triple mode redundant (TMR) pipeline circuit such that the MMR pipeline circuit layout is a TMR circuit layout and the MMRSCSSE layouts are triple mode redundant self-correcting sequential state element (TMRSCSSE) layouts.

15. The computer program product implemented method of claim 14 wherein the instructions cause the processor to create a floorplan of the IC layout using the EDA program wherein the floorplan defines a first DMR region, a second DMR region, and a TMR region within the IC layout and the floorplan has three boundary restrictions such that each of the three boundary restrictions defines a different one of three interleaved regions within the TMR region of the IC layout and the three interleaved regions are interweaved with one another and wherein:

a first one of the three boundary restrictions defines a first polygon within the first DMR region that is continuous with a first one of the three interleaved regions within the TMR region; and a second one of the three boundary restrictions defines a second polygon within the second DMR region that is continuous with a second one of the three interleaved regions within the TMR region; and place the TMR pipeline circuit layout within the TMR region of the IC layout such that the initial redundant CLC layouts of the TMR pipeline circuit layout are provided within the three interleaved regions and the TMRSCSSE layouts are provided across each of the three interleaved regions of the IC layout.

16. The computer implemented method of claim 15 wherein the instructions cause the processor to:

place a first redundant pipeline circuit layout of a first in silico redundant pipeline circuit of the in silico DMR pipeline circuit within the first polygon;

place a second redundant pipeline circuit layout of a second in silico redundant pipeline circuit of the in silico DMR pipeline circuit within the second polygon; and place the updated redundant CLC layouts of the in silico TMR pipeline circuit such that each of the updated redundant CLC layouts is provided in a different one of the three interleaved regions.

17. The computer implemented method of claim 14 wherein the instructions cause the processor to:
    create a floorplan of the IC layout using the EDA program wherein the floorplan defines a first DMR region, a second DMR region, and a TMR region within the IC layout, and the floorplan has three boundary restrictions such that each of the three boundary restrictions defines a one of the three interleaved regions within the TMR region, the first DMR region, and the second DMR region of the IC layout and wherein the three interleaved regions are interweaved with one another; and
    place the TMR pipeline circuit layout within the TMR region of the IC layout such that the initial redundant CLC layouts of the TMR pipeline circuit layout are provided within the three interleaved regions, and the TMRSCSSE layouts are provided across each of the three interleaved regions of the IC layout.

18. The computer implemented method of claim 17 wherein the instructions cause the processor to:
    place a first redundant pipeline circuit layout of a first in silico redundant pipeline circuit of the in silico DMR pipeline circuit within the first DMR region and within a first one of the three interleaved regions;
    place a second redundant pipeline circuit layout of a second in silico redundant pipeline circuit of the in silico DMR pipeline circuit within the second DMR region and within a second one of the three interleaved regions; and
    place updated redundant CLC layouts of the in silico TMR pipeline circuit within the TMR region and such that each of the updated redundant CLC layouts is provided in a different one of the three interleaved regions.

19. The computer program product of claim 14 wherein the instructions cause the processor to:
    create a floorplan of the IC layout using the EDA program wherein the floorplan defines a first DMR region, a second DMR region, and a TMR region within the IC layout, and the floorplan has three boundary restrictions such that:
        each of the three boundary restrictions defines a one of the three interleaved regions wherein the three interleaved regions are interwoven with one another and wherein:
            a first one of the three interleaved regions is provided within the TMR region, the first DMR region, and the second DMR region of the IC layout;
            a second one of the three interleaved regions is provided within the TMR region, the first DMR region, and the second DMR region of the IC layout; and
            a third one of the three interleaved regions is provided only within the TMR region and is interleaved between the first one and the second one of the three interleaved regions within the TMR region; and
    place the TMR pipeline circuit layout within the TMR region of the IC layout such that the initial redundant CLC layouts of the TMR pipeline circuit layout are provided within the three interleaved regions, and the TMRSCSSE layouts are provided across each of the three interleaved regions of the IC layout.

20. The computer program product of claim 19 wherein the instructions cause the processor to:
    place a first redundant pipeline circuit layout of a first in silico redundant pipeline circuit of the in silico DMR pipeline circuit within the first DMR region and within the first one of the three interleaved regions;
    place a second redundant pipeline circuit layout of a second in silico redundant pipeline circuit of the in silico DMR pipeline circuit within the second DMR region and within the second one of the three interleaved regions; and
    place updated redundant CLC layouts of the in silico TMR pipeline circuit within the TMR region and such that each of the updated redundant CLC layouts is provided in a different one of the three interleaved regions.

21. The computer program product of claim 14 wherein the instructions cause the processor to:
    create a floorplan of the IC layout using the EDA program wherein the floorplan defines a first DMR region, a second DMR region, and a TMR region within the IC layout and the floorplan has three boundary restrictions such that:
        each of the three boundary restrictions defines a one of the three interleaved regions within the TMR region wherein the three interleaved regions are interweaved with one another;
        a first one of the three boundary restrictions defines a first polygon within the first DMR region and a second polygon within the second DMR region such that the first polygon and the second polygon are continuous with a first one of the three interleaved regions within the TMR region; and
        a second one of the three boundary restrictions defines a third polygon within the first DMR region and a fourth polygon within the second DMR region such that the third polygon and the fourth polygon are continuous with a second one of the three interleaved regions within the TMR region; and
    place the TMR pipeline circuit layout within the TMR region of the IC layout such that the initial redundant CLC layouts of the TMR pipeline circuit layout are provided within the three interleaved regions and the TMRSCSSE layouts are provided across each of the three interleaved regions of the IC layout.

22. The computer program product of claim 21 wherein the instructions cause the processor to:
    place a first redundant pipeline circuit layout of a first in silico redundant pipeline circuit of the in silico DMR pipeline circuit within the first polygon and the third polygon;
    place a second redundant pipeline circuit layout of a second in silico redundant pipeline circuit of the in silico DMR pipeline circuit within the second polygon and the fourth polygon; and
    place updated redundant CLC layouts of the in silico TMR pipeline circuit within the TMR region and such that each of the updated redundant CLC layouts is provided in a different one of the three interleaved regions.

23. An electronic computational system, comprising:
    a computer readable medium configured to store an electronic design automation (EDA) program, and a gate-level netlist of an in silico integrated circuit (IC) having an in silico multi-mode redundant (MMR) pipeline circuit; and
    one or more processors configured to implement the EDA program, wherein the EDA program is executable to cause the one or more processors to:
        load the gate-level netlist of the in silico IC into the EDA program;
        generate an IC layout of the in silico IC based on the gate-level netlist with the EDA program, wherein the IC layout has an MMR pipeline circuit layout of the in silico MMR pipeline circuit, and the MMR pipeline circuit layout includes initial redundant combinational logic circuit (CLC) layouts and multi-mode redundant self-correcting sequential state element (MMRSCSSE) layouts;

render the MMRSCSSE layouts immotile within the IC layout;

remove the initial redundant CLC layouts of the MMR pipeline circuit layout from the IC layout; and place updated redundant CLC layouts in the MMR pipeline circuit layout based on the gate-level netlist with the EDA program after the MMRSCSSE layouts have been rendered immotile.

24. The electronic computational system of claim 23 wherein the gate-level netlist is of the in silico IC such that the in silico IC further comprises an in silico dual mode redundant (DMR) pipeline circuit layout and wherein the in silico MMR pipeline circuit is a triple mode redundant (TMR) pipeline circuit such that the MMR pipeline circuit layout is a TMR circuit layout and the MMRSCSSE layouts are triple mode redundant self-correcting sequential state element (TMRSCSSE) layouts and wherein the EDA program executed by the one or more processors further causes the one or more processors to place the DMR pipeline circuit layout of the in silico DMR pipeline circuit in the IC layout after the TMRSCSSE layouts have been rendered immotile.

25. The electronic computational system of claim 23 wherein the EDA program causes the one or more processors to generate the IC layout of the in silico IC based on the gate-level netlist with the EDA program by being configured to:

create a floorplan of the IC layout using the EDA program wherein the floorplan has boundary restrictions that define a plurality of interleaved regions within the IC layout and wherein the plurality of interleaved regions are interweaved with one another;

place each of the MMRSCSSE layouts of the in silico MMR pipeline circuit within the plurality of interleaved regions.

\* \* \* \* \*